(12) United States Patent
Heger et al.

(10) Patent No.: US 11,784,619 B2
(45) Date of Patent: Oct. 10, 2023

(54) DISCIPLINING CRYSTALS TO SYNCHRONIZE TIMING OF INDEPENDENT NODES

(71) Applicants: Jason Heger, Louisville, CO (US); Gerald Nilles, Culver City, CA (US)

(72) Inventors: Jason Heger, Louisville, CO (US); Gerald Nilles, Culver City, CA (US)

(73) Assignee: Snap Inc., Santa Monica, CA (US)

( * ) Notice: Subject to any disclaimer, the term of this patent is extended or adjusted under 35 U.S.C. 154(b) by 18 days.

(21) Appl. No.: 17/494,487

(22) Filed: Oct. 5, 2021

(65) Prior Publication Data
US 2023/0108702 A1   Apr. 6, 2023

(51) Int. Cl.
*H03F 3/66* (2006.01)
*H03F 3/191* (2006.01)
*H03F 3/45* (2006.01)
*H03F 3/26* (2006.01)
*H03L 7/099* (2006.01)

(52) U.S. Cl.
CPC ............... *H03F 3/66* (2013.01); *H03F 3/191* (2013.01); *H03F 3/26* (2013.01); *H03F 3/45179* (2013.01); *H03L 7/0995* (2013.01); *H03F 2203/45631* (2013.01)

(58) Field of Classification Search
CPC ... H03F 3/66; H03F 3/191; H03F 3/26; H03F 3/45179; H03F 2203/45631; H03L 7/0995; G06F 1/12; G06F 1/163
USPC .................................................. 330/127, 302
See application file for complete search history.

(56) References Cited

U.S. PATENT DOCUMENTS

| 10,719,100 B2 | 7/2020 | Zaidman et al. |
| 10,944,818 B1 | 3/2021 | Izenberg et al. |
| 10,997,949 B2 | 5/2021 | John et al. |
| 2004/0117682 A1 | 6/2004 | Xu |
| 2010/0202436 A1 | 8/2010 | Albert et al. |
| 2011/0254935 A1 | 10/2011 | MacNaughton et al. |
| 2014/0019794 A1 | 1/2014 | Chandhoke et al. |

(Continued)

FOREIGN PATENT DOCUMENTS

| CA | 1020631 A | 11/1977 |
| WO | 2021066993 A1 | 4/2021 |

OTHER PUBLICATIONS

International Search Report and Written Opinion received in Patent Cooperation Treaty Application No. PCT/US2022/044671, dated Jan. 26, 2023.

(Continued)

*Primary Examiner* — Hieu P Nguyen
(74) *Attorney, Agent, or Firm* — Culhane Meadows PLLC; Stephen J. Weed

(57) ABSTRACT

A circuit includes a first system-on-chip (SoC) driven by a first clock generator and a second SoC driven by a second clock generator where the first clock generator and the second clock generator have independent time bases. The first and second clock generators are synchronized using an RLC circuit external to the first clock generator and the second clock generator that converts an output of the first clock generator into current pulses and injects the current pulses into the second clock generator to pull an output of the second clock generator into synchronization with the output of the first clock generator. The RLC circuit converts a voltage output of the first clock generator into current pulses at the resonant frequency or specific harmonics of the output of the first clock generator. The second clock generator may include a ring oscillator into which the current pulses are injected.

20 Claims, 24 Drawing Sheets

(56) References Cited

U.S. PATENT DOCUMENTS

| | | |
|---|---|---|
| 2015/0317273 A1 | 11/2015 | Errickson et al. |
| 2016/0252728 A1 | 9/2016 | Mack et al. |
| 2019/0064891 A1 | 2/2019 | Ashwood et al. |
| 2019/0101953 A1 | 4/2019 | Chen et al. |
| 2019/0110264 A1 | 4/2019 | Chung et al. |
| 2019/0155327 A1 | 5/2019 | Zaidman et al. |
| 2019/0243472 A1 | 8/2019 | Stafford et al. |
| 2020/0220549 A1 | 7/2020 | Oja et al. |
| 2021/0034095 A1 | 2/2021 | Lele et al. |
| 2022/0006922 A1 | 1/2022 | Bathija et al. |
| 2022/0085969 A1 | 3/2022 | Finan et al. |
| 2022/0092003 A1* | 3/2022 | Aharony .................. G06F 1/20 |
| 2023/0109476 A1* | 4/2023 | Ahn ...................... H04J 3/0682 370/503 |

OTHER PUBLICATIONS

International Search Report and Written Opinion received Patent Cooperation Treaty Application No. PCT/JS2022/044666, dated Jan. 13, 2023.

International Search Report and Written Opinion received Patent Cooperation Treaty Application No. PCT/JS2022/044804, dated Jan. 13, 2023.

International Search Report and Written Opinion received Patent Cooperation Treaty Application No. PCT/JS2022/044967, dated Feb. 10, 2023.

International Search Report and Written Opinion received Patent Cooperation Treaty Application No. PCT/JS2022/044977, dated Feb. 2, 2023.

\* cited by examiner

DISCIPLINING CRYSTALS TO SYNCHRONIZE TIMING OF INDEPENDENT NODES

TECHNICAL FIELD

The present subject matter relates to multi-node systems and, more particularly, to techniques for synchronizing the timing of nodes having independent time bases in multi-node systems by injecting current pulses generated from the clock generator circuit of a primary node into the clock generator circuit of a secondary node.

BACKGROUND

Many types of electronic devices available today, such as mobile devices (e.g., smartphones, tablets, and laptops), handheld devices, and wearable devices (e.g., smart glasses, digital eyewear, headwear, headgear, and head-mounted displays), include an operating system that supports a variety of cameras, sensors, wireless transceivers, input systems (e.g., touch-sensitive surfaces, pointers), peripheral devices, displays, and graphical user interfaces (GUIs) through which a user can interact with displayed content. Such electronic devices may include one or more processors for implementing the device functionality.

BRIEF DESCRIPTION OF THE DRAWINGS

The features of the various examples described will be readily understood from the following detailed description, in which reference is made to the figures. A reference numeral is used with each element in the description and throughout the several views of the drawings. When a plurality of similar elements is present, a single reference numeral may be assigned to like elements, with an added letter referring to a specific element. The letter may be dropped when referring to more than one of the elements or a non-specific one of the elements.

The various elements shown in the figures are not drawn to scale unless otherwise indicated. The dimensions of the various elements may be enlarged or reduced in the interest of clarity. The several figures depict one or more implementations and are presented by way of example only and should not be construed as limiting. Included in the drawing are the following figures.

DETAILED DESCRIPTION

Figure 1A:
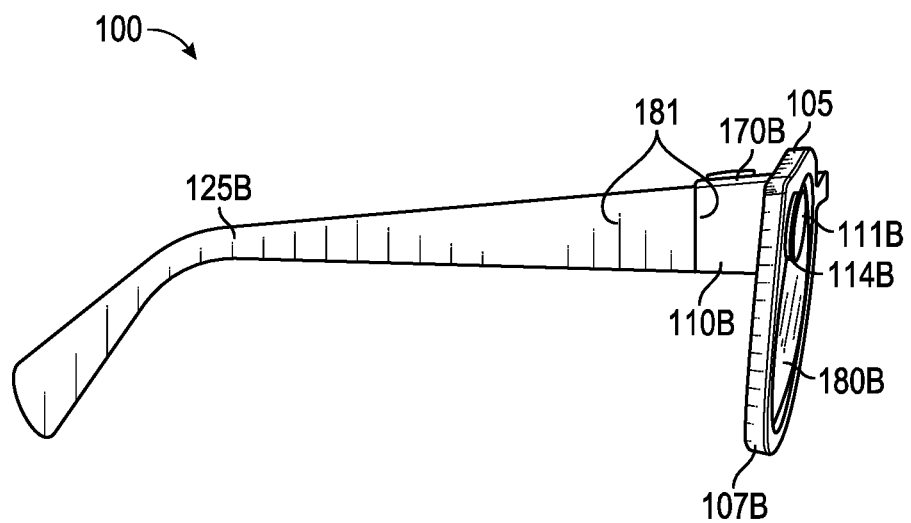
FIG. 1A is a side view (right) of an example hardware configuration of an eyewear device suitable for use in an eyewear system.

Examples described herein relate to techniques for synchronizing the timing of primary and secondary nodes having independent time bases (i.e., not driven by same clock generator circuit) by injecting current pulses generated from the clock generator circuit of the primary node into the clock generator circuit of the secondary node. The injected current pulses slightly shift the resonant frequencies of the clock signals generated by the clock generator circuit of the secondary node as the injected current pulses are slightly different in frequency from the original resonant frequency or its harmonics or subharmonics. The injected pulses thus pull the crystal of the clock generator of the secondary node to an adjusted frequency in synchronization with the output frequency of the clock generator circuit of the primary node. The current may not be injected directly into the oscillator, and it is desired to shift the oscillation frequency into synchronization with the clock generator circuit output of the primary node without adjusting capacitors or other circuit components of the clock generator circuits. In a sample configuration, this is accomplished using an external passive RLC circuit that injects current pulses generated from the clock output of a clock generator circuit of the primary node into the clock generator circuit of the secondary node to synchronize the respective timing signals output by the respective clock generator circuits.

The systems and methods described herein are described for use in connection with an electronic eyewear device comprising two or more systems-on-chip that work together to implement the functionality of the electronic eyewear device. It will be appreciated that the techniques described herein also may be used with other devices with two or more nodes that need to share the same time base but may not share the same crystal oscillator. Thus, the descriptions provided herein are for explanatory purposes only and not to limit the described systems and methods to any particular device or device configuration.

In sample configurations, systems and methods are described herein for synchronizing the timing of respective systems-on-chip of an electronic eyewear device. A first system-on-chip driven by a first clock generator is synchronized with a second system-on-chip driven by a second clock generator where the first clock generator and the second clock generator have independent time bases. The first and second clock generators are synchronized using an RLC circuit external to the first clock generator and the second clock generator that converts an output of the first clock generator into current pulses and injects the current pulses into the second clock generator to pull an output of the second clock generator into synchronization with the output of the first clock generator. The RLC circuit converts the voltage output of the first clock generator into current pulses at the resonant frequency or specific harmonics of the output of the first clock generator. The second clock generator may include a ring oscillator into which the current pulses are injected.

The following detailed description includes systems, methods, techniques, instruction sequences, and computing machine program products illustrative of examples set forth in the disclosure. Numerous details and examples are included for the purpose of providing a thorough understanding of the disclosed subject matter and its relevant teachings. Those skilled in the relevant art, however, may understand how to apply the relevant teachings without such details. Aspects of the disclosed subject matter are not limited to the specific devices, systems, and method described because the relevant teachings can be applied or practiced in a variety of ways. The terminology and nomenclature used herein is for the purpose of describing particular aspects only and is not intended to be limiting. In general, well-known instruction instances, protocols, structures, and techniques are not necessarily shown in detail.

The terms "system-on-chip" or "SoC" are used herein to refer to an integrated circuit (also known as a "chip") that integrates components of an electronic system on a single substrate or microchip. These components include a central processing unit (CPU), a graphical processing unit (GPU), an image signal processor (ISP), a memory controller, a video decoder, and a system bus interface for connection to another SoC. The components of the SoC may additionally include, by way of non-limiting example, one or more of an interface for an inertial measurement unit (IMU; e.g., I2C, SPI, I3C, etc.), a video encoder, a transceiver (TX/RX; e.g., WI-FI®, BLUETOOTH®, or a combination thereof), and digital, analog, mixed-signal, and radio frequency signal processing functions.

The terms "virtual machine" or "VM" are used herein to refer to a software representation of a computer. A VM may be implemented in hardware, software, or a combination thereof.

The terms "self-contained virtual machine" or "SCVM" are used herein to refer to a virtual machine having an OS that is configured to provide at least one service. In one example, the SCVM regulates the resources that it uses (e.g., according to a resource budget), with the electronic device on which it operates provisioned to have those resources available. An SCVM may have more than one set of resources (e.g., multiple resource budgets), with the SCVM selecting the set of resources responsive to, for example, the operating mode of an electronic device on which the SCVM is present. Where a SCVM provides more than one service, each service runs in a respective container of the SCVM. Each container runs in a respective partition of the SCVM with a kernel of the SCVM implementing isolation between the containers.

The term "system isolation manager" is user herein to refer to computer software, firmware, or hardware (or a combination thereof) that manages a collection of virtual machines, containers, or a combination thereof to support isolation and communication between virtual machines/containers. Where virtual machines are managed to support isolation, the system isolation manager may be a hypervisor. Where containers are managed to support isolation, the system isolation manager may be a container manager such as Docker available from Docker, Inc. of Palo Alto, Calif., USA.

The term "hypervisor" is used herein to refer to computer software, firmware, or hardware (or a combination thereof) that generates and runs virtual machines. A computing system (e.g., an SoC) on which a hypervisor runs one or more virtual machines may be referred to as a host machine and each virtual machine may be referred to as a guest machine. The hypervisor presents the OSs of the guest machines with a virtual operating platform and manages the execution of the guest OSs.

The terms "operating system" and "OS" are used herein to refer to software that supports basic functions of a computer (real or virtual; e.g., a virtual machine), such as scheduling tasks, executing applications, and controlling peripherals. In one example, a supervisor OS is implemented in the hypervisor and a respective OS is implemented in each of the SCVMs.

The terms "coupled" or "connected" as used herein refer to any logical, optical, physical, or electrical connection, including a link or the like by which the electrical or magnetic signals produced or supplied by one system element are imparted to another coupled or connected system element. Unless described otherwise, coupled or connected elements or devices are not necessarily directly connected to one another and may be separated by intermediate components, elements, or communication media, one or more of which may modify, manipulate, or carry the electrical signals. The term "on" means directly supported by an element or indirectly supported by the element through another element that is integrated into or supported by the element.

The term "proximal" is used to describe an item or part of an item that is situated near, adjacent, or next to an object or person; or that is closer relative to other parts of the item, which may be described as "distal." For example, the end of an item nearest an object may be referred to as the proximal end, whereas the generally opposing end may be referred to as the distal end.

The orientations of the eyewear device, other mobile devices, associated components, and any other devices incorporating a camera, an inertial measurement unit, or both such as shown in any of the drawings, are given by way of example only, for illustration and discussion purposes. In operation, the eyewear device may be oriented in any other direction suitable to the particular application of the eyewear device; for example, up, down, sideways, or any other orientation. Also, to the extent used herein, any directional term, such as front, rear, inward, outward, toward, left, right, lateral, longitudinal, up, down, upper, lower, top, bottom, side, horizontal, vertical, and diagonal are used by way of example only, and are not limiting as to the direction or orientation of any camera or inertial measurement unit as constructed or as otherwise described herein.

Additional objects, advantages and novel features of the examples will be set forth in part in the following description, and in part will become apparent to those skilled in the art upon examination of the following and the accompanying drawings or may be learned by production or operation of the examples. The objects and advantages of the present subject matter may be realized and attained by means of the methodologies, instrumentalities and combinations particularly pointed out in the appended claims.

Reference now is made in detail to the examples illustrated in the accompanying drawings and discussed below. FIGS. 1-12 describe an electronic eyewear device having two or more systems-on-chip in which the systems and methods described herein may be implemented in sample configurations. FIGS. 13-14 describe sample configurations for adjusting the clock generator circuit of the secondary node in response to a clock output of the clock generator circuit of the primary node to synchronize the timing signals of the primary node and the secondary node.

FIG. 1A is a side view (right) of an example hardware configuration of an eyewear device 100 which includes a touch-sensitive input device or touchpad 181. As shown, the touchpad 181 may have a boundary that is subtle and not easily seen; alternatively, the boundary may be plainly visible or include a raised or otherwise tactile edge that provides feedback to the user about the location and boundary of the touchpad 181. In other implementations, the eyewear device 100 may include a touchpad on the left side. The surface of the touchpad 181 is configured to detect finger touches, taps, and gestures (e.g., moving touches) for use with a GUI displayed by the eyewear device, on an image display, to allow the user to navigate through and select menu options in an intuitive manner, which enhances and simplifies the user experience.

Detection of finger inputs on the touchpad 181 can enable several functions. For example, touching anywhere on the touchpad 181 may cause the GUI to display or highlight an item on the image display, which may be projected onto at least one of the optical assemblies 180A, 180B. Double tapping on the touchpad 181 may select an item or icon. Sliding or swiping a finger in a particular direction (e.g., from front to back, back to front, up to down, or down to up) may cause the items or icons to slide or scroll in a particular direction; for example, to move to a next item, icon, video, image, page, or slide. Sliding the finger in another direction may slide or scroll in the opposite direction; for example, to move to a previous item, icon, video, image, page, or slide. The touchpad 181 can be virtually anywhere on the eyewear device 100.

In one example, an identified finger gesture of a single tap on the touchpad 181, initiates selection or pressing of a graphical user interface element in the image presented on the image display of the optical assembly 180A, 180B. An adjustment to the image presented on the image display of the optical assembly 180A, 180B based on the identified finger gesture can be a primary action which selects or submits the graphical user interface element on the image display of the optical assembly 180A, 180B for further display or execution.

As shown in FIG. 1A, the eyewear device 100 includes a right visible-light camera 114B. As further described herein, two cameras 114A, 114B capture image information for a scene from two separate viewpoints. The two captured images may be used to project a three-dimensional display onto an image display for viewing on or with 3D glasses.

Figure 1B:
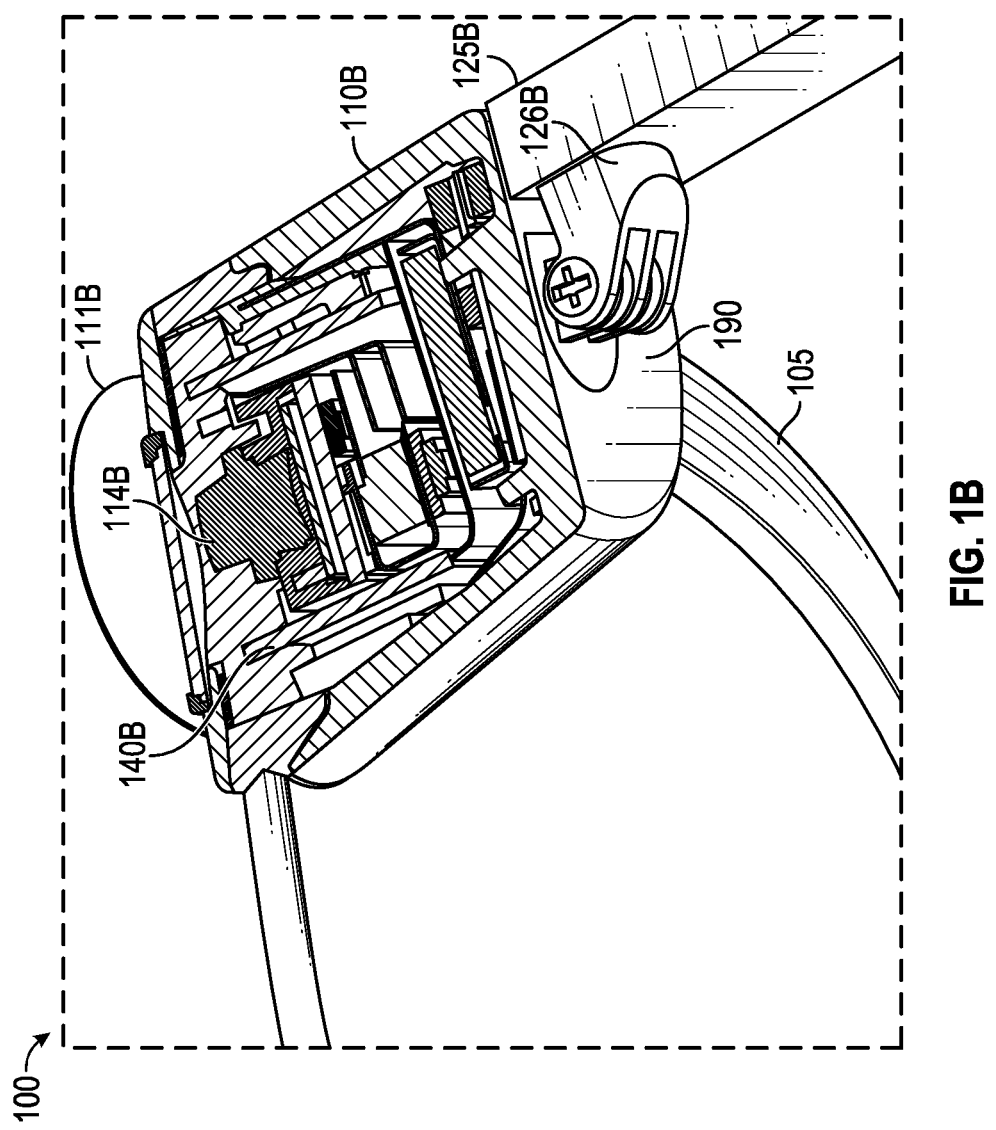
FIG. 1B is a perspective, partly sectional view of a right temple portion of the eyewear device of FIG. 1A depicting a right visible-light camera, and a circuit board.
Figure 1C:
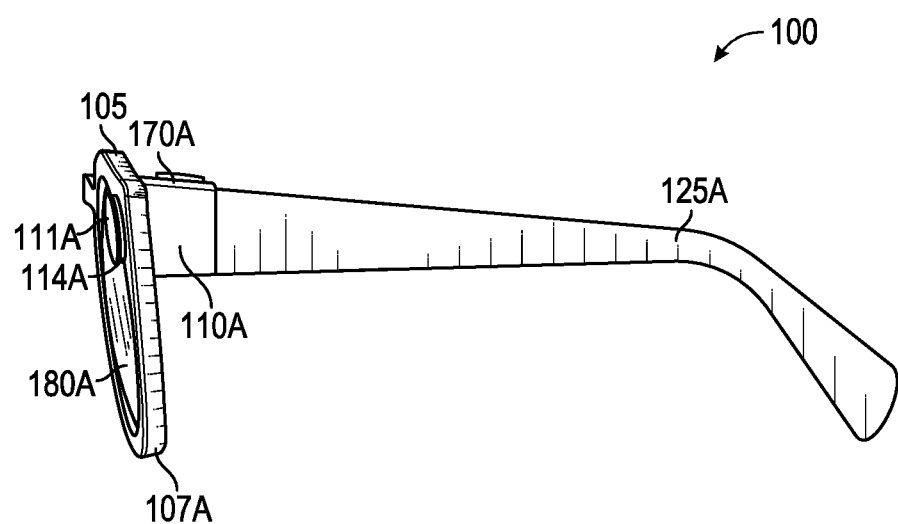
FIG. 1C is a side view (left) of an example hardware configuration of the eyewear device of FIG. 1A, which shows a left visible-light camera.
Figure 1D:
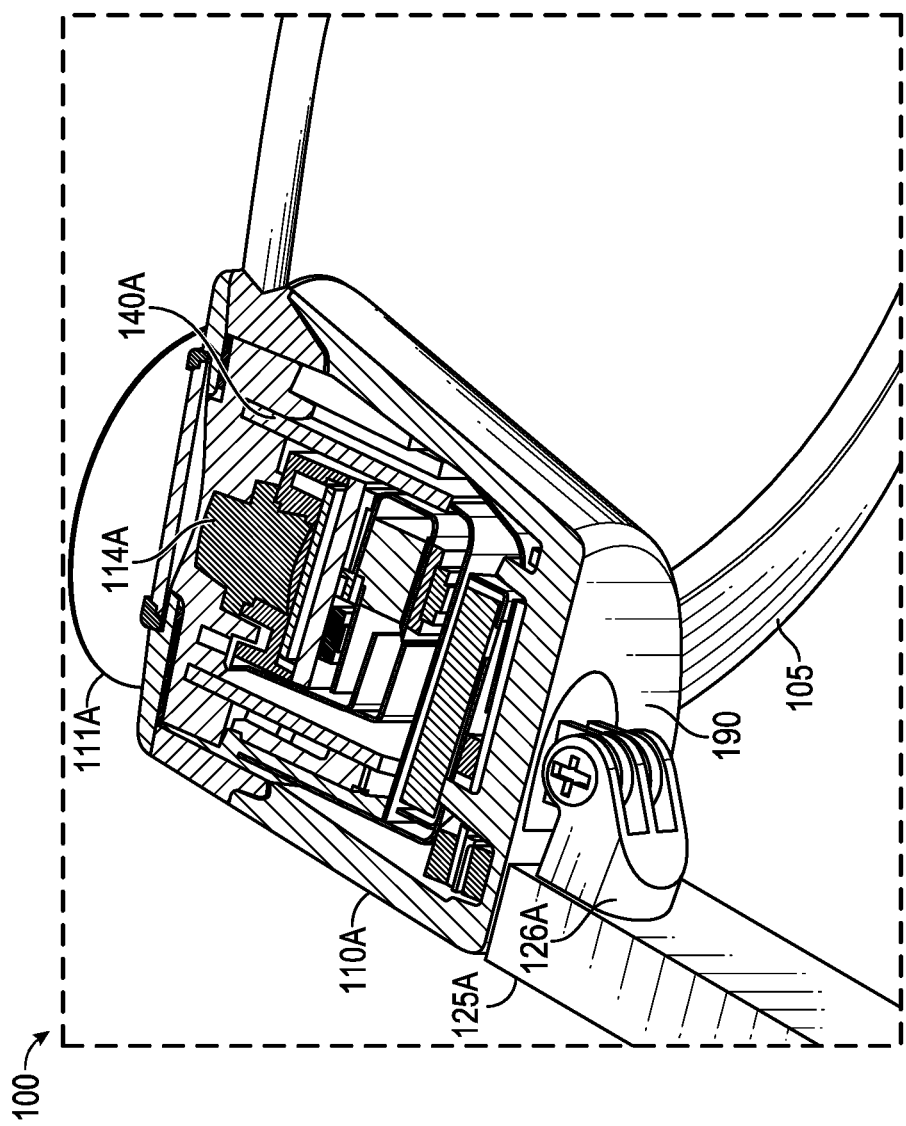
FIG. 1D is a perspective, partly sectional view of a left temple portion of the eyewear device of FIG. 1C depicting the left visible-light camera, and a circuit board.

The eyewear device 100 includes a right optical assembly 180B with an image display to present images, such as depth images. As shown in FIGS. 1A and 1B, the eyewear device 100 includes the right visible-light camera 114B. The eyewear device 100 can include multiple visible-light cameras 114A, 114B that form a passive type of three-dimensional camera, such as stereo camera, of which the right visible-light camera 114B is located on a right temple portion 110B. As shown in FIGS. 1C-D, the eyewear device 100 also includes a left visible-light camera 114A location on a left temple portion 110A.

Figure 3:
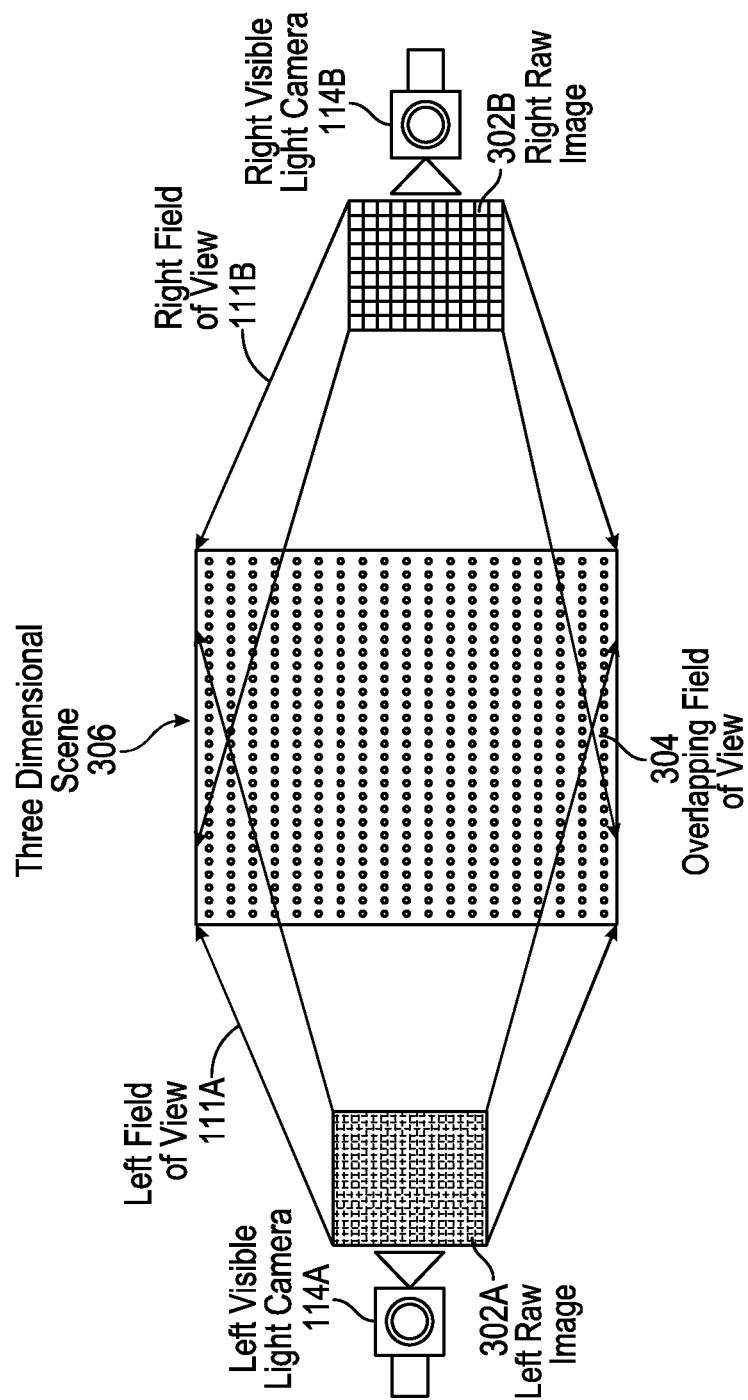
FIG. 3 is a diagrammatic depiction of a three-dimensional scene formed by a left raw image captured by a left visible-light camera and a right raw image captured by a right visible-light camera.

Left and right visible-light cameras 114A, 114B are sensitive to the visible-light range wavelength. Each of the visible-light cameras 114A, 114B have a different frontward facing field of view which are overlapping to enable generation of three-dimensional depth images. Right visible-light camera 114B captures a right field of view 111B and left visible-light camera 114A captures a left field of view 111A. Generally, a "field of view" is the part of the scene that is visible through the camera at a particular position and orientation in space. The fields of view 111A and 111B have an overlapping field of view 304 (FIG. 3). Objects or object features outside the field of view 111A, 111B when the visible-light camera captures the image are not recorded in a raw image (e.g., photograph or picture). The field of view describes an angle range or extent in which the image sensor of the visible-light camera 114A, 114B picks up electromagnetic radiation of a given scene in a captured image of the given scene. Field of view can be expressed as the angular size of the view cone; i.e., an angle of view. The angle of view can be measured horizontally, vertically, or diagonally.

In an example, visible-light cameras 114A, 114B have a field of view with an angle of view between 15° to 30°, for example 24°, and have a resolution of 480×480 pixels or greater. In another example, the field of view can be much wider, such as 100° or greater. The "angle of coverage" describes the angle range that a lens of visible-light cameras 114A, 114B or infrared camera 220 (see FIG. 2A) can effectively image. Typically, the camera lens produces an image circle that is large enough to cover the film or sensor of the camera completely, possibly including some vignetting (e.g., a darkening of the image toward the edges when compared to the center). If the angle of coverage of the camera lens does not fill the sensor, the image circle will be visible, typically with strong vignetting toward the edge, and the effective angle of view will be limited to the angle of coverage.

Examples of such visible-light cameras 114A, 114B include a high-resolution complementary metal-oxide-semiconductor (CMOS) image sensor and a digital VGA camera (video graphics array) capable of resolutions of 640p (e.g., 640×480 pixels for a total of 0.3 megapixels), 720p, or 1080p. Other examples of visible-light cameras 114A, 114B that can capture high-definition (HD) still images and store them at a resolution of 1642 by 1642 pixels (or greater); or record high-definition video at a high frame rate (e.g., thirty to sixty frames per second or more) and store the recording at a resolution of 1216 by 1216 pixels (or greater).

The eyewear device 100 may capture image sensor data from the visible-light cameras 114A, 114B along with geolocation data, digitized by an image processor, for storage in a memory. The visible-light cameras 114A, 114B capture respective left and right raw images in the two-dimensional space domain that comprise a matrix of pixels on a two-dimensional coordinate system that includes an X-axis for horizontal position and a Y-axis for vertical position. Each pixel includes a color attribute value (e.g., a red pixel light value, a green pixel light value, or a blue pixel light value) and a position attribute (e.g., an X-axis coordinate and a Y-axis coordinate).

In order to capture stereo images for later display as a three-dimensional projection, an image processor 412 (shown in FIG. 4) may be coupled to the visible-light cameras 114A, 114B to receive and store the visual image information. The image processor 412, or another processor, controls operation of the visible-light cameras 114A, 114B to act as a stereo camera simulating human binocular vision and may add a timestamp to each image. The timestamp on each pair of images allows display of the images together as part of a three-dimensional projection. Three-dimensional projections produce an immersive, life-like experience that is desirable in a variety of contexts, including virtual reality (VR) and video gaming.

FIG. 1B is a perspective, cross-sectional view of a right temple portion 110B of the eyewear device 100 of FIG. 1A depicting the right visible-light camera 114B of the camera system, and a circuit board. FIG. 1C is a side view (left) of an example hardware configuration of an eyewear device 100 of FIG. 1A, which shows a left visible-light camera 114A of the camera system. FIG. 1D is a perspective, cross-sectional view of a left temple portion 110A of the eyewear device of FIG. 1C depicting the left visible-light camera 114A of the three-dimensional camera, and a circuit board. Construction and placement of the left visible-light camera 114A is substantially similar to the right visible-light camera 114B, except the connections and coupling are on the left lateral side 170A.

As shown in the example of FIG. 1B, the eyewear device 100 includes the right visible-light camera 114B and a circuit board 140B, which may be a flexible printed circuit board (PCB). A right hinge 126B connects the right temple portion 110B to a right temple 125B of the eyewear device 100. In some examples, components of the right visible-light camera 114B, the flexible PCB 140B, or other electrical connectors or contacts may be located on the right temple 125B, the right hinge 126B, the right temple portion 110B, the frame 105, or a combination thereof. The components (or subset thereof) may be incorporated in a SoC.

As shown in the example of FIG. 1D, the eyewear device 100 includes the left visible-light camera 114A and a circuit board 140A, which may be a flexible printed circuit board (PCB). A left hinge 126A connects the left temple portion 110A to a left temple 125A of the eyewear device 100. In some examples, components of the left visible-light camera 114A, the flexible PCB 140A, or other electrical connectors or contacts may be located on the left temple 125A, the left hinge 126A, the left temple portion 110A, the frame 105, or a combination thereof. The components (or subset thereof) may be incorporated in a SoC.

The left temple portion 110A and the right temple portion 110B includes temple portion body 190 and a temple portion cap, with the temple portion cap omitted in the cross-section of FIG. 1B and FIG. 1D. Disposed inside the left temple portion 110A and the right temple portion 110B are various interconnected circuit boards, such as PCBs or flexible PCBs, that include controller circuits for the respective left visible-light camera 114A and the right visible-light camera 114B, microphone(s) 130, speaker 132, low-power wireless circuitry (e.g., for wireless short range network communication via BLUETOOTH®), high-speed wireless circuitry (e.g., for wireless local area network communication via WI-FI®). The components and circuitry (or subset thereof) in each temple portion 110 may be incorporated in a SoC.

Figure 2A:
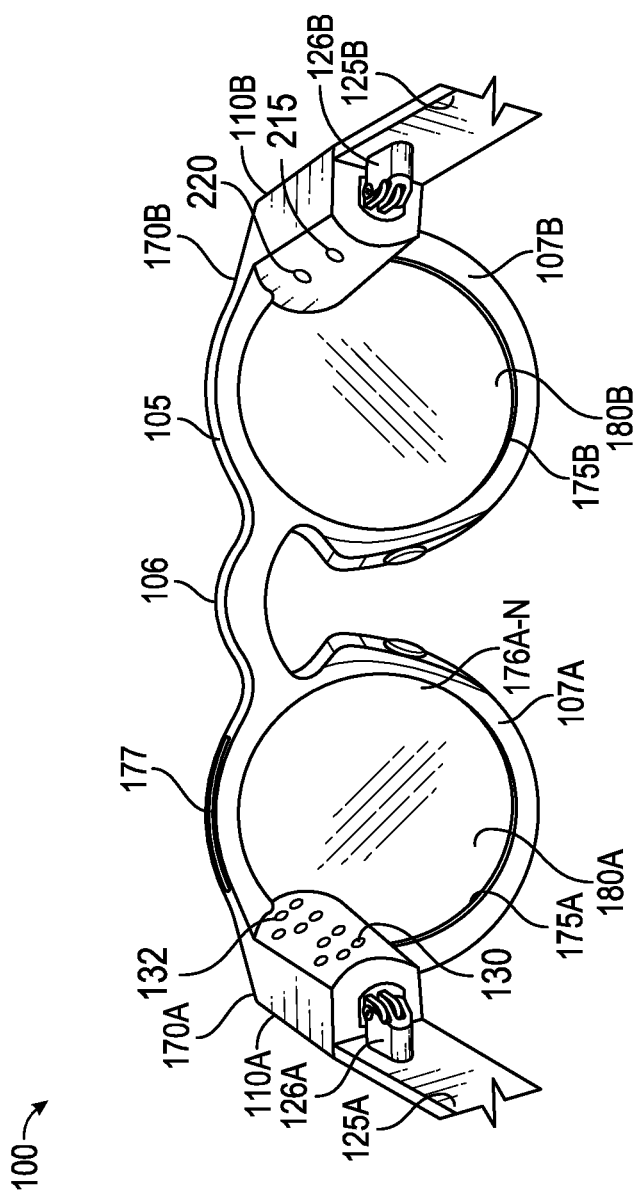
FIGS. 2A and 2B are rear views of example hardware configurations of an eyewear device utilized in the eyewear system.

The right visible-light camera 114B is coupled to or disposed on the flexible PCB 140B and covered by a visible-light camera cover lens, which is aimed through opening(s) formed in the frame 105. For example, the right rim 107B of the frame 105, shown in FIG. 2A, is connected to the right temple portion 110B and includes the opening(s) for the visible-light camera cover lens. The frame 105 includes a front side configured to face outward and away from the eye of the user. The opening for the visible-light camera cover lens is formed on and through the front or outward-facing side of the frame 105. In the example, the right visible-light camera 114B has an outward-facing field of view 111B (shown in FIG. 3) with a line of sight or perspective that is correlated with the right eye of the user of the eyewear device 100. The visible-light camera cover lens can also be adhered to a front side or outward-facing surface of the right temple portion 110B in which an opening is formed with an outward-facing angle of coverage, but in a different outwardly direction. The coupling can also be indirect via intervening components. Although shown as being formed on the circuit boards of the right temple portion 110B, the right visible-light camera 114B can be formed on the circuit boards of the left temple 125B or the frame 105.

The left visible-light camera 114A is coupled to or disposed on the flexible PCB 140A and covered by a visible-light camera cover lens, which is aimed through opening(s) formed in the frame 105. For example, the left rim 107A of the frame 105, shown in FIG. 2A, is connected to the left temple portion 110A and includes the opening(s) for the visible-light camera cover lens. The frame 105 includes a front side configured to face outward and away from the eye of the user. The opening for the visible-light camera cover lens is formed on and through the front or outward-facing side of the frame 105. In the example, the left visible-light camera 114A has an outward-facing field of view 111A (shown in FIG. 3) with a line of sight or perspective that is correlated with the left eye of the user of the eyewear device 100. The visible-light camera cover lens can also be adhered to a front side or outward-facing surface of the left temple portion 110A in which an opening is formed with an outward-facing angle of coverage, but in a different outwardly direction. The coupling can also be indirect via intervening components. Although shown as being formed on the circuit boards of the left temple portion 110A, the left visible-light camera 114A can be formed on the circuit boards of the left temple 125A or the frame 105.

Figure 2B:
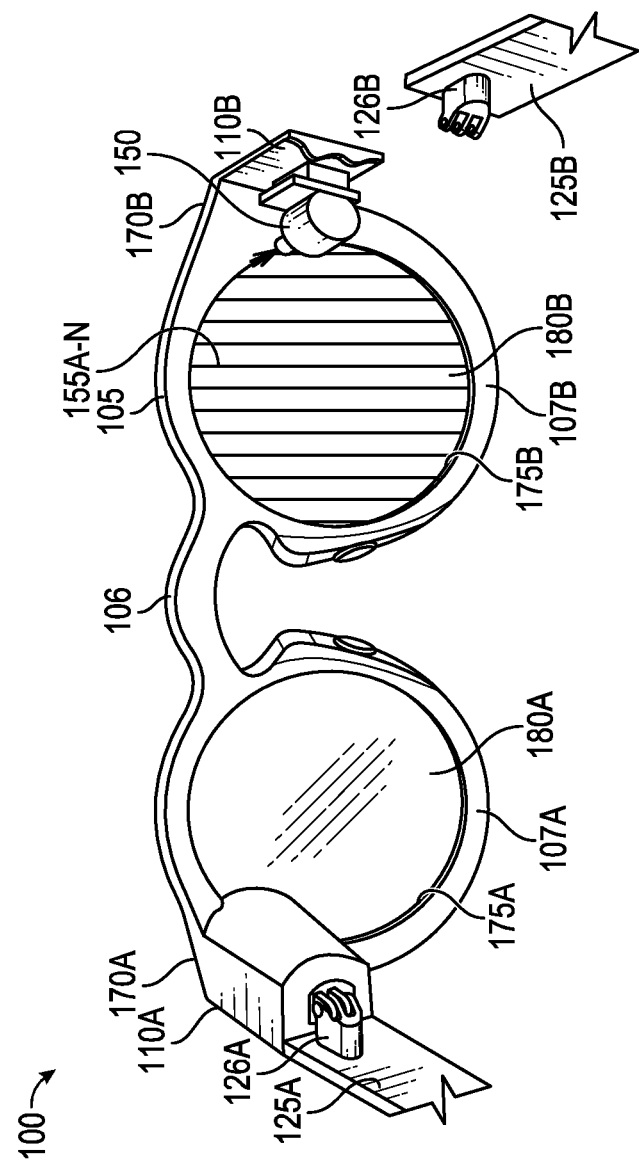

FIGS. 2A and 2B are perspective views, from the rear, of example hardware configurations of the eyewear device 100, including two different types of image displays. The eyewear device 100 is sized and shaped in a form configured for wearing by a user; the form of eyeglasses is shown in the example. The eyewear device 100 can take other forms and may incorporate other types of frameworks; for example, a headgear, a headset, or a helmet.

In the eyeglasses example, eyewear device 100 includes a frame 105 including a left rim 107A connected to a right rim 107B via a bridge 106 adapted to be supported by a nose of the user. The left and right rims 107A, 107B include respective apertures 175A, 175B, which hold a respective optical element 180A, 180B, such as a lens and a display device. As used herein, the term "lens" is meant to include transparent or translucent pieces of glass or plastic having curved or flat surfaces that cause light to converge/diverge or that cause little or no convergence or divergence.

Although shown as having two optical elements 180A, 180B, the eyewear device 100 can include other arrangements, such as a single optical element (or it may not include any optical element 180A, 180B), depending on the application or the intended user of the eyewear device 100. As further shown, eyewear device 100 includes a left temple portion 110A adjacent the left lateral side 170A of the frame 105 and a right temple portion 110B adjacent the right lateral side 170B of the frame 105. The temple portions 110A, 110B may be integrated into the frame 105 on the respective lateral sides 170A, 170B (as illustrated) or implemented as separate components attached to the frame 105 on the respective lateral sides 170A, 170B. Alternatively, the temple portions 110A, 110B may be integrated into temples (not shown) attached to the frame 105.

In one example, the image display of optical assembly 180A, 180B includes an integrated image display 177. As shown in FIG. 2A, each optical assembly 180A, 180B includes a suitable display matrix 177, such as a liquid crystal display (LCD), an organic light-emitting diode (OLED) display, or any other such display. Each optical assembly 180A, 180B also includes an optical layer or layers 176, which can include lenses, optical coatings, prisms, mirrors, waveguides, optical strips, and other optical components in any combination. The optical layers 176A, 176B, . . . 176N (shown as 176A-N in FIG. 2A and herein) can include a prism having a suitable size and configuration and including a first surface for receiving light from a display matrix and a second surface for emitting light to the eye of the user. The prism of the optical layers 176A-N extends over all or at least a portion of the respective apertures 175A, 175B formed in the left and right rims 107A, 107B to permit the user to see the second surface of the prism when the eye of the user is viewing through the corresponding left and right rims 107A, 107B. The first surface of the prism of the optical layers 176A-N faces upwardly from the frame 105 and the display matrix 177 overlies the prism so that photons and light emitted by the display matrix 177 impinge the first surface. The prism is sized and shaped so that the light is refracted within the prism and is directed toward the eye of the user by the second surface of the prism of the optical layers 176A-N. In this regard, the second surface of the prism of the optical layers 176A-N can be convex to direct the light toward the center of the eye. The prism can optionally be sized and shaped to magnify the image projected by the display matrix 177, and the light travels through the prism so that the image viewed from the second surface is larger in one or more dimensions than the image emitted from the display matrix 177.

In one example, the optical layers 176A-N may include an LCD layer that is transparent (keeping the lens open) unless and until a voltage is applied which makes the layer opaque (closing or blocking the lens). The image processor 412 on the eyewear device 100 may execute programming to apply the voltage to the LCD layer in order to produce an active shutter system, making the eyewear device 100 suitable for viewing visual content when displayed as a three-dimensional projection. Technologies other than LCD may be used for the active shutter mode, including other types of reactive layers that are responsive to a voltage or another type of input.

In another example, the image display device of optical assembly 180A, 180B includes a projection image display as shown in FIG. 2B. Each optical assembly 180A, 180B may include a laser projector 150, which is a three-color laser projector using a scanning mirror or galvanometer. During operation, an optical source such as laser projector 150 is disposed in or on one or both of the temples 125A, 125B of the eyewear device 100. Optical assembly 180B in this example includes one or more optical strips 155A, 155B, . . . 155N (shown as 155A-N in FIG. 2B) which are spaced apart and across the width of the lens of each optical assembly 180A, 180B or across a depth of the lens between the front surface and the rear surface of the lens.

As the photons projected by the laser projector 150 travel across the lens of each optical assembly 180A, 180B, the photons encounter the optical strips 155A-N. When a particular photon encounters a particular optical strip, the photon is either redirected toward the user's eye, or it passes to the next optical strip. A combination of modulation of laser projector 150, and modulation of optical strips, may control specific photons or beams of light. In an example, a processor controls optical strips 155A-N by initiating mechanical, acoustic, or electromagnetic signals. Although shown as having two optical assemblies 180A, 180B, the eyewear device 100 can include other arrangements, such as a single or three optical assemblies, or each optical assembly 180A, 180B may have arranged different arrangement depending on the application or intended user of the eyewear device 100.

In another example, the eyewear device 100 shown in FIG. 2B may include two projectors, a left projector (not shown) and a right projector (shown as projector 150). The left optical assembly 180A may include a left display matrix (not shown) or a left set of optical strips (not shown) which are configured to interact with light from the left projector. In this example, the eyewear device 100 includes a left display and a right display.

As further shown in FIGS. 2A and 2B, eyewear device 100 includes a left temple portion 110A adjacent the left lateral side 170A of the frame 105 and a right temple portion 110B adjacent the right lateral side 170B of the frame 105. The temple portions 110A, 110B may be integrated into the frame 105 on the respective lateral sides 170A, 170B (as illustrated) or implemented as separate components attached to the frame 105 on the respective lateral sides 170A, 170B. Alternatively, the temple portions 110A, 110B may be integrated into temples 125A, 125B attached to the frame 105.

As shown in FIG. 2A, the frame 105 or one or more of the left and right temples 110A-B may include an infrared emitter 215 and an infrared camera 220. The infrared emitter 215 and the infrared camera 220 can be connected to the flexible PCB 140B by soldering, for example. Other arrangements of the infrared emitter 215 and infrared camera 220 can be implemented, including arrangements in which the infrared emitter 215 and infrared camera 220 are both on the right rim 107B, or in different locations on the frame 105, for example, the infrared emitter 215 is on the left rim 107A and the infrared camera 220 is on the right rim 107B. In another example, the infrared emitter 215 is on the frame 105 and the infrared camera 220 is on one of the temples 110A-B, or vice versa. The infrared emitter 215 can be connected essentially anywhere on the frame 105, left temple 110A, or right temple 110B to emit a pattern of infrared light. Similarly, the infrared camera 220 can be connected essentially anywhere on the frame 105, left temple 110A, or right temple 110B to capture at least one reflection variation in the emitted pattern of infrared light.

The infrared emitter 215 and infrared camera 220 are arranged to face inwards towards an eye of the user with a partial or full field of view of the eye in order to identify the respective eye position and gaze direction. For example, the infrared emitter 215 and infrared camera 220 are positioned directly in front of the eye, in the upper part of the frame 105 or in the temples 110A-B at either end of the frame 105.

Figure 2C:
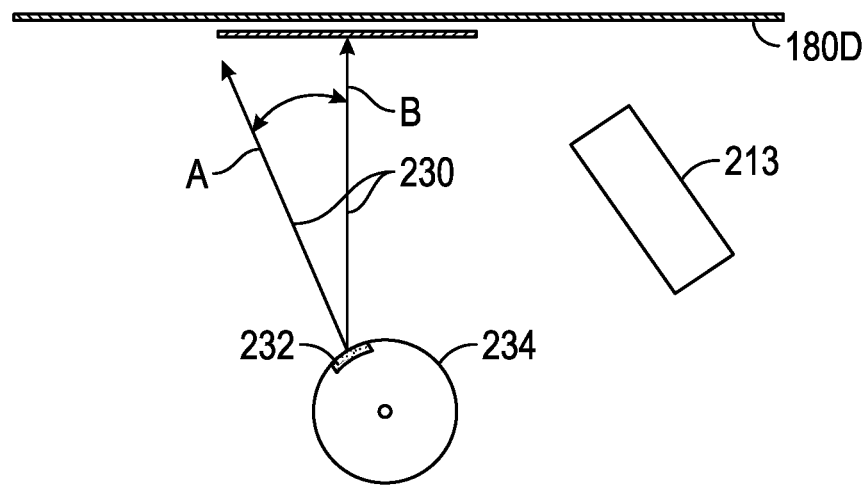
FIG. 2C illustrates detecting eye gaze direction.
Figure 2D:
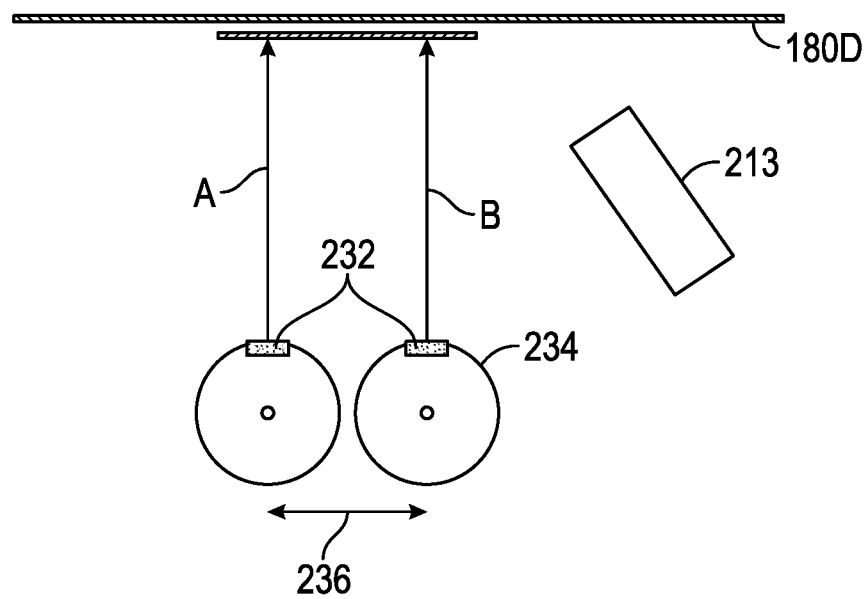
FIG. 2D illustrates detecting eye position.

In an example, the processor 432 (FIG. 4) utilizes an eye tracker 213 to determine an eye gaze direction 230 of a wearer's eye 234 as shown in FIG. 2C, and an eye position 236 of the wearer's eye 234 within an eyebox as shown in FIG. 2D. In one example, the eye tracker 213 is a scanner which uses infrared light illumination (e.g., near-infrared, short-wavelength infrared, mid-wavelength infrared, long-wavelength infrared, or far infrared) to capture images of reflection variations of infrared light from the eye 234 to determine the gaze direction 230 of a pupil 232 of the eye 234, and also the eye position 236 with respect to the display 180D, which may include one or both of optical assemblies 180A and 180B.

FIG. 3 is a diagrammatic depiction of a three-dimensional scene 306, a left raw image 302A captured by a left visible-light camera 114A, and a right raw image 302B captured by a right visible-light camera 114B. The left field of view 111A may overlap, as shown, with the right field of view 111B. The overlapping field of view 304 represents that portion of the image captured by both cameras 114A, 114B. The term 'overlapping' when referring to field of view means the matrix of pixels in the generated raw images overlap by thirty percent (30%) or more. 'Substantially overlapping' means the matrix of pixels in the generated raw images—or in the infrared image of scene—overlap by fifty percent (50%) or more. As described herein, the two raw images 302A, 302B may be processed to include a timestamp, which allows the images to be displayed together as part of a three-dimensional projection.

For the capture of stereo images, as illustrated in FIG. 3, a pair of raw red, green, and blue (RGB) images are captured of a real scene 306 at a given moment in time—a left raw image 302A captured by the left camera 114A and right raw image 302B captured by the right camera 114B. When the pair of raw images 302A, 302B are processed (e.g., by the image processor 412), depth images are generated. The generated depth images may be viewed on an optical assembly 180A, 180B of an eyewear device, on another display (e.g., the image display 580 on a mobile device 401), or on a screen.

The generated depth images are in the three-dimensional space domain and can comprise a matrix of vertices on a three-dimensional location coordinate system that includes an X axis for horizontal position (e.g., length), a Y axis for vertical position (e.g., height), and a Z axis for depth (e.g., distance). Each vertex may include a color attribute (e.g., a red pixel light value, a green pixel light value, or a blue pixel light value); a position attribute (e.g., an X location coordinate, a Y location coordinate, and a Z location coordinate); a texture attribute; a reflectance attribute; or a combination thereof. The texture attribute quantifies the perceived texture of the depth image, such as the spatial arrangement of color or intensities in a region of vertices of the depth image.

In one example, an eyewear system 400 (FIG. 4) includes the eyewear device 100, which includes a frame 105, a left temple 110A extending from a left lateral side 170A of the frame 105, and a right temple 125B extending from a right lateral side 170B of the frame 105. The eyewear device 100 may further include at least two visible-light cameras 114A, 114B having overlapping fields of view. In one example, the eyewear device 100 includes a left visible-light camera 114A with a left field of view 111A, as illustrated in FIG. 3. The left camera 114A is connected to the frame 105, left temple 125A, or left temple portion 110A to capture a left raw image 302A from the left side of scene 306. The eyewear device 100 further includes a right visible-light camera 114B with a right field of view 111B. The right camera 114B is connected to the frame 105, right temple 125B, or right temple portion 110B to capture a right raw image 302B from the right side of scene 306.

Figure 4:
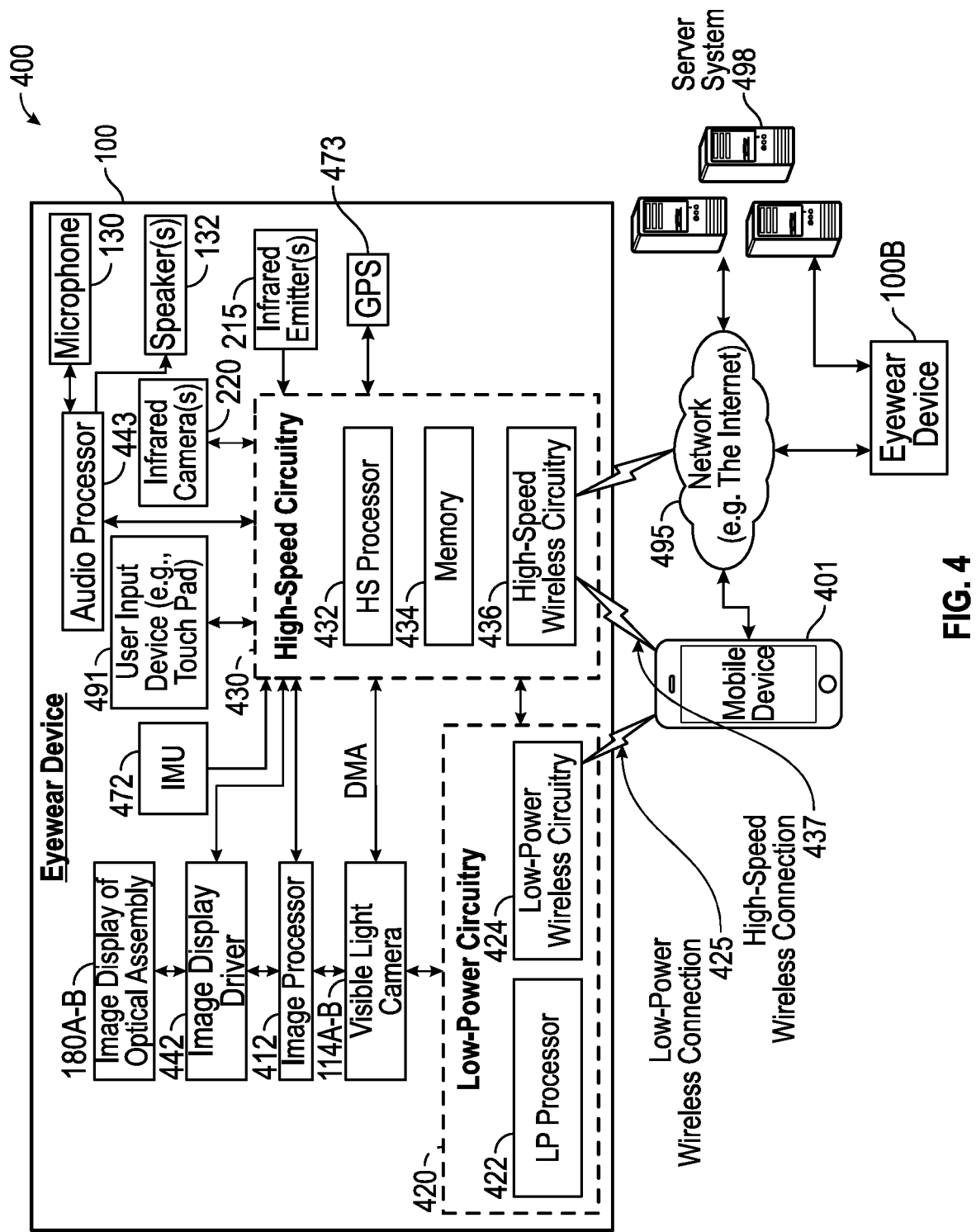
FIG. 4 is a functional block diagram of an example eyewear system including an eyewear device connected to a mobile device and a server system via various networks.

FIG. 4 is a functional block diagram of an example eyewear system 400 that includes a wearable device (e.g., an eyewear device 100), a mobile device 401, and a server system 498 connected via various networks 495 such as the Internet. The eyewear system 400 includes a low-power wireless connection 425 and a high-speed wireless connection 437 between the eyewear device 100 and the mobile device 401.

As shown in FIG. 4, the eyewear device 100 includes one or more visible-light cameras 114A, 114B that capture still images, video images, or both still and video images, as described herein. The cameras 114A, 114B may have a direct memory access (DMA) to high-speed circuitry 430 and function as a stereo camera. The cameras 114A, 114B may be used to capture initial-depth images that may be rendered into three-dimensional (3D) models that are texture-mapped images of a red, green, and blue (RGB) imaged scene.

The eyewear device 100 further includes two optical assemblies 180A, 180B (one associated with the left lateral side 170A and one associated with the right lateral side 170B). The eyewear device 100 also includes an image display driver 442, an image processor 412, low-power circuitry 420, and high-speed circuitry 430 (all of which may be duplicated and incorporated into a pair of SoCs located on the eyewear device 100). The image displays 177 of each optical assembly 180A, 180B are for presenting images, including still images, video images, or still and video images. The image display driver 442 is coupled to the image displays of each optical assembly 180A, 180B in order to control the display of images.

The eyewear device 100 additionally includes one or more microphones 130 and speakers 132 (e.g., one of each associated with the left side of the eyewear device and another associated with the right side of the eyewear device). The microphones 130 and speakers 132 may be incorporated into the frame 105, temples 125, or temple portions 110 of the eyewear device 100. The one or more speakers 132 are driven by audio processor 443 (which may be duplicated and incorporated into a pair of SoCs) under control of low-power circuitry 420, high-speed circuitry 430, or both. The speakers 132 are for presenting audio signals including, for example, a beat track. The audio processor 443 is coupled to the speakers 132 in order to control the presentation of sound.

The components shown in FIG. 4 for the eyewear device 100 are located on one or more circuit boards, for example a printed circuit board (PCB) or flexible printed circuit (FPC) of one or more SoCs, located in the rims or temples. Alternatively, or additionally, the depicted components can be located in the temple portions, frames, hinges, or bridge of the eyewear device 100. Left and right visible-light cameras 114A, 114B can include digital camera elements such as a complementary metal-oxide-semiconductor (CMOS) image sensor, a charge-coupled device, a lens, or any other respective visible or light capturing elements that may be used to capture data, including still images or video of scenes with unknown objects.

As shown in FIG. 4, high-speed circuitry 430 includes a high-speed processor 432, a memory 434, and high-speed wireless circuitry 436. In the example, the image display driver 442 is coupled to the high-speed circuitry 430 and operated by the high-speed processor 432 in order to drive the left and right image displays of each optical assembly 180A, 180B. High-speed processor 432 may be any processor capable of managing high-speed communications and operation of any general computing system needed for eyewear device 100. High-speed processor 432 includes processing resources needed for managing high-speed data transfers on high-speed wireless connection 437 to a wireless local area network (WLAN) using high-speed wireless circuitry 436.

In some examples, the high-speed processor 432 executes an OS such as a LINUX OS or other such OS of the eyewear device 100 and the OS is stored in memory 434 for execution. In addition to any other responsibilities, the high-speed processor 432 executes a software architecture for the eyewear device 100 that is used to manage data transfers with high-speed wireless circuitry 436. In some examples, high-speed wireless circuitry 436 is configured to implement Institute of Electrical and Electronic Engineers (IEEE) 802.11 communication standards, also referred to herein as WI-FI®. In other examples, other high-speed communications standards may be implemented by high-speed wireless circuitry 436.

The low-power circuitry 420 includes a low-power processor 422 and low-power wireless circuitry 424. The low-power wireless circuitry 424 and the high-speed wireless circuitry 436 of the eyewear device 100 can include short-range transceivers (BLUETOOTH® or Bluetooth Low-Energy (BLE)) and wireless wide, local, or wide-area network transceivers (e.g., cellular or WI-FI®). Mobile device 401, including the transceivers communicating via the low-power wireless connection 425 and the high-speed wireless connection 437, may be implemented using details of the architecture of the eyewear device 100, as can other elements of the network 495.

Memory 434 includes any storage device capable of storing various data and applications, including, among other things, camera data generated by the left and right visible-light cameras 114A, 114B, the infrared camera(s) 220 in response to reflected emissions from infrared emitter 215, the image processor 412, and images generated for display 177 by the image display driver 442 on the image display of each optical assembly 180A, 180B. Although the memory 434 is shown as integrated with high-speed circuitry 430, the memory 434 in other examples may be an independent, standalone element of the eyewear device 100. In certain such examples, electrical routing lines may provide a connection through a chip that includes the high-speed processor 432 from the image processor 412 or low-power processor 422 to the memory 434. In other examples, the high-speed processor 432 may manage addressing of memory 434 such that the low-power processor 422 will boot the high-speed processor 432 any time that a read or write operation involving memory 434 is needed.

Figure 5:
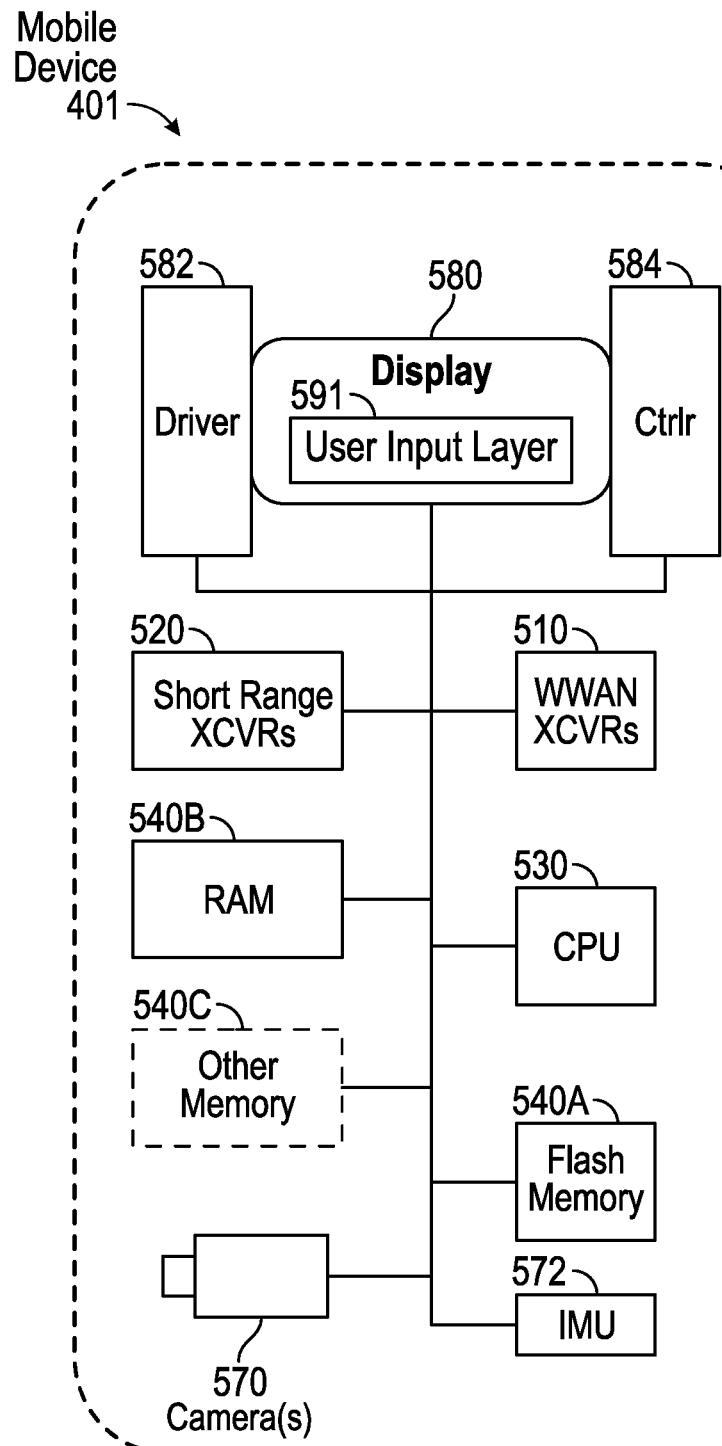
FIG. 5 is a diagrammatic representation of an example hardware configuration for a mobile device of the eyewear system of FIG. 4.

As shown in FIG. 4, the high-speed processor 432 of the eyewear device 100 can be coupled to the camera system (visible-light cameras 114A, 114B), the image display driver 442, the user input device 491, and the memory 434. As shown in FIG. 5, the CPU 530 of the mobile device 401 may be coupled to a camera system 570, a mobile display driver 582, a user input layer 591, and a flash memory 540A.

The server system 498 may be one or more computing devices as part of a service or network computing system, for example, that include a processor, a memory, and network communication interface to communicate over the network 495 with one or more eyewear devices 100 and 100B and a mobile device 401.

The output components of the eyewear device 100 include visual elements, such as the left and right image displays associated with each lens or optical assembly 180A, 180B as described in FIGS. 2A and 2B (e.g., a display such as a liquid crystal display (LCD), a plasma display panel (PDP), a light emitting diode (LED) display, a projector, or a waveguide). The eyewear device 100 may include a user-facing indicator (e.g., an LED, a loudspeaker, or a vibrating actuator), or an outward-facing signal (e.g., an LED, a loudspeaker). The image displays of each optical assembly 180A, 180B are driven by the image display driver 442. In some example configurations, the output components of the eyewear device 100 further include additional indicators such as audible elements (e.g., loudspeakers), tactile components (e.g., an actuator such as a vibratory motor to generate haptic feedback), and other signal generators. For example, the device 100 may include a user-facing set of indicators, and an outward-facing set of signals. The user-facing set of indicators are configured to be seen or otherwise sensed by the user of the device 100. For example, the device 100 may include an LED display positioned so the user can see it, a one or more speakers positioned to generate a sound the user can hear, or an actuator to provide haptic feedback the user can feel. The outward-facing set of signals are configured to be seen or otherwise sensed by an observer near the device 100. Similarly, the device 100 may include an LED, a loudspeaker, or an actuator that is configured and positioned to be sensed by an observer.

The input components of the eyewear device 100 may include input components (e.g., a touch screen or touchpad 181 configured to receive alphanumeric input, a photo-optical keyboard, or other alphanumeric-configured elements), pointer-based input components (e.g., a mouse, a touchpad, a trackball, a joystick, a motion sensor, or other pointing instruments), tactile input components (e.g., a button switch, a touch screen or touchpad that senses the location, force or location and force of touches or touch gestures, or other tactile-configured elements), and audio input components (e.g., a microphone), and the like. The mobile device 401 and the server system 498 may include alphanumeric, pointer-based, tactile, audio, and other input components.

In some examples, the eyewear device 100 includes a collection of motion-sensing components referred to as an inertial measurement unit 472 (which may be duplicated and incorporated into a pair of SoCs). The motion-sensing components may be micro-electro-mechanical systems (MEMS) with microscopic moving parts, often small enough to be part of a microchip. The inertial measurement unit (IMU) 472 in some example configurations includes an accelerometer, a gyroscope, and a magnetometer. The accelerometer senses the linear acceleration of the device 100 (including the acceleration due to gravity) relative to three orthogonal axes (x, y, z). The gyroscope senses the angular velocity of the device 100 about three axes of rotation (pitch, roll, yaw). Together, the accelerometer and gyroscope can provide position, orientation, and motion data about the device relative to six axes (x, y, z, pitch, roll, yaw). The magnetometer, if present, senses the heading of the device 100 relative to magnetic north. The position of the device 100 may be determined by location sensors, such as a GPS unit 473, one or more transceivers to generate relative position coordinates, altitude sensors or barometers, and other orientation sensors (which may be duplicated and incorporated into a pair of SoCs). Such positioning system coordinates can also be received over the wireless connections 425, 437 from the mobile device 401 via the low-power wireless circuitry 424 or the high-speed wireless circuitry 436.

The inertial management unit (IMU) 472 may include or cooperate with a digital motion processor or programming that gathers the raw data from the components and compute a number of useful values about the position, orientation, and motion of the device 100. For example, the acceleration data gathered from the accelerometer can be integrated to obtain the velocity relative to each axis (x, y, z); and integrated again to obtain the position of the device 100 (in linear coordinates, x, y, and z). The angular velocity data from the gyroscope can be integrated to obtain the position of the device 100 (in spherical coordinates). The programming for computing these useful values may be stored in memory 434 and executed by the high-speed processor 432 of the eyewear device 100.

The eyewear device 100 may optionally include additional peripheral sensors, such as biometric sensors, specialty sensors, or display elements integrated with eyewear device 100. For example, peripheral device elements may include any I/O components including output components, motion components, position components, or any other such elements described herein. For example, the biometric sensors may include components to detect expressions (e.g., hand expressions, facial expressions, vocal expressions, body gestures, or eye tracking), to measure bio signals (e.g., blood pressure, heart rate, body temperature, perspiration, or brain waves), or to identify a person (e.g., identification based on voice, retina, facial characteristics, fingerprints, or electrical bio signals such as electroencephalogram data), and the like.

The mobile device 401 may be a smartphone, tablet, laptop computer, access point, or any other such device capable of connecting with eyewear device 100 using both a low-power wireless connection 425 and a high-speed wireless connection 437. Mobile device 401 is connected to server system 498 and network 495. The network 495 may include any combination of wired and wireless connections.

The eyewear system 400, as shown in FIG. 4, includes a computing device, such as mobile device 401, coupled to an eyewear device 100 over a network 495. The eyewear system 400 includes a memory for storing instructions and a processor for executing the instructions. Execution of the instructions of the eyewear system 400 by the processor 432 configures the eyewear device 100 to cooperate with the mobile device 401, and also with another eyewear device 100B over the network 495. The eyewear system 400 may utilize the memory 434 of the eyewear device 100 or the memory elements 540A, 540B, 540C of the mobile device 401 (FIG. 5).

Any of the functionality described herein for the eyewear device 100, the mobile device 401, and the server system 498 can be embodied in one or more computer software applications or sets of programming instructions, as described herein. According to some examples, "function," "functions," "application," "applications," "instruction," "instructions," or "programming" are program(s) that execute functions defined in the programs. Various programming languages can be employed to develop one or more of the applications, structured in a variety of manners, such as object-oriented programming languages (e.g., Objective-C, Java, or C++) or procedural programming languages (e.g., C or assembly language). In a specific example, a third-party application (e.g., an application developed using the ANDROID™ or IOS™ software development kit (SDK) by an entity other than the vendor of the particular platform) may include mobile software running on a mobile OS such as IOS™, ANDROID™, WINDOWS® Phone, or another mobile OSs. In this example, the third-party application can invoke API calls provided by the OS to facilitate functionality described herein.

Hence, a machine-readable medium may take many forms of tangible storage medium. Non-volatile storage media include, for example, optical or magnetic disks, such as any of the storage devices in any computer devices or the like, such as may be used to implement the client device, media gateway, transcoder, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a PROM and EPROM, a FLASH-EPROM, any other memory chip or cartridge, a carrier wave transporting data or instructions, cables or links transporting such a carrier wave, or any other medium from which a computer may read programming code or data. Many of these forms of computer readable media may be involved in carrying one or more sequences of one or more instructions to a processor for execution.

FIG. 5 is a high-level functional block diagram of an example mobile device 401. Mobile device 401 includes a flash memory 540A which stores programming to be executed by the CPU 530. The mobile device 401 also may include a camera 570 that comprises at least two visible-light cameras (first and second visible-light cameras with overlapping fields of view) or at least one visible-light camera and a depth sensor with substantially overlapping fields of view. Flash memory 540A may further include multiple images or video, which are generated via the camera 570.

As shown, the mobile device 401 includes an image display 580, a mobile display driver 582 to drive the image display 580, and a display controller 584 to control the image display 580. In the example of FIG. 5, the image display 580 includes a user input layer 591 (e.g., a touchscreen) that is layered on top of or otherwise integrated into the screen used by the image display 580. Examples of touchscreen-type mobile devices that may be used include (but are not limited to) a smart phone, a personal digital assistant (PDA), a tablet computer, a laptop computer, or other portable device. However, the structure and operation of the touchscreen-type devices is provided by way of example; the subject technology as described herein is not intended to be limited thereto. For purposes of this discussion, FIG. 5 therefore provides a block diagram illustration of the example mobile device 401 with a user interface that includes a touchscreen input layer 591 for receiving input (by touch, multi-touch, or gesture, and the like, by hand, stylus, or other tool) and an image display 580 for displaying content.

As shown in FIG. 5, the mobile device 401 includes at least one digital transceiver (XCVR) 510, shown as WWAN XCVRs, for digital wireless communications via a wide-area wireless mobile communication network. The mobile device 401 also includes additional digital or analog transceivers, such as short-range transceivers (XCVRs) 520 for short-range network communication, such as via NFC, VLC, DECT, ZigBee, BLUETOOTH®, or WI-FI®. For example, short range XCVRs 520 may take the form of any available two-way wireless local area network (WLAN) transceiver of a type that is compatible with one or more standard protocols of communication implemented in wireless local area networks, such as one of the WI-FI® standards under IEEE 802.11.

To generate location coordinates for positioning of the mobile device 401, the mobile device 401 can include a global positioning system (GPS) receiver. Alternatively, or additionally the mobile device 401 can utilize either or both the short range XCVRs 520 and WWAN XCVRs 510 for generating location coordinates for positioning. For example, cellular network, WI-FI®, or BLUETOOTH® based positioning systems can generate very accurate location coordinates, particularly when used in combination. Such location coordinates can be transmitted to the eyewear device over one or more network connections via XCVRs 510, 520.

The transceivers 510, 520 (i.e., the network communication interface) conforms to one or more of the various digital wireless communication standards utilized by modern mobile networks. Examples of WWAN transceivers 510 include (but are not limited to) transceivers configured to operate in accordance with Code Division Multiple Access (CDMA) and 3rd Generation Partnership Project (3GPP) network technologies including, for example and without limitation, 3GPP type 2 (or 3GPP2) and LTE, at times referred to as "4G." The transceivers may also incorporate broadband cellular network technologies referred to as "5G." For example, the transceivers 510, 520 provide two-way wireless communication of information including digitized audio signals, still image and video signals, web page information for display as well as web-related inputs, and various types of mobile message communications to/from the mobile device 401.

The mobile device 401 further includes a microprocessor that functions as a central processing unit (CPU) 530. A processor is a circuit having elements structured and arranged to perform one or more processing functions, typically various data processing functions. Although discrete logic components could be used, the examples utilize components forming a programmable CPU. A microprocessor for example includes one or more integrated circuit (IC) chips incorporating the electronic elements to perform the functions of the CPU. The CPU 530, for example, may be based on any known or available microprocessor architecture, such as a Reduced Instruction Set Computing (RISC) using an ARM architecture, as commonly used today in mobile devices and other portable electronic devices. Of course, other arrangements of processor circuitry may be used to form the CPU 530 or processor hardware in smartphone, laptop computer, and tablet.

The CPU 530 serves as a programmable host controller for the mobile device 401 by configuring the mobile device 401 to perform various operations, for example, in accordance with instructions or programming executable by CPU 530. For example, such operations may include various general operations of the mobile device, as well as operations related to the programming for applications on the mobile device. Although a processor may be configured by use of hardwired logic, typical processors in mobile devices are general processing circuits configured by execution of programming.

The mobile device 401 includes a memory or storage system, for storing programming and data. In the example, the memory system may include a flash memory 540A, a random-access memory (RAM) 540B, and other memory components 540C, as needed. The RAM 540B serves as short-term storage for instructions and data being handled by the CPU 530, e.g., as a working data processing memory. The flash memory 540A typically provides longer-term storage.

Hence, in the example of mobile device 401, the flash memory 540A is used to store programming or instructions for execution by the CPU 530. Depending on the type of device, the mobile device 401 stores and runs a mobile OS through which specific applications are executed. Examples of mobile OSs include Google Android, Apple iOS (for iPhone or iPad devices), Windows Mobile, Amazon Fire OS, RIM BlackBerry OS, or the like.

Finally, the mobile device 401 may further include an inertial measurement unit (IMU) 572 which, in some example configurations, may include an accelerometer, a gyroscope, and a magnetometer.

The processor 432 within the eyewear device 100 may construct a map of the environment surrounding the eyewear device 100, determine a location of the eyewear device within the mapped environment, and determine a relative position of the eyewear device to one or more objects in the mapped environment. The processor 432 may construct the map and determine location and position information using a simultaneous localization and mapping (SLAM) algorithm applied to data received from one or more sensors. In the context of augmented reality, a SLAM algorithm is used to construct and update a map of an environment, while simultaneously tracking and updating the location of a device (or a user) within the mapped environment. The mathematical solution can be approximated using various statistical methods, such as particle filters, Kalman filters, extended Kalman filters, and covariance intersection.

Sensor data includes images received from one or both of the cameras 114A, 114B, distance(s) received from a laser range finder, position information received from a GPS unit 473, or a combination of two or more of such sensor data, or from other sensors providing data useful in determining positional information.

Figure 6:
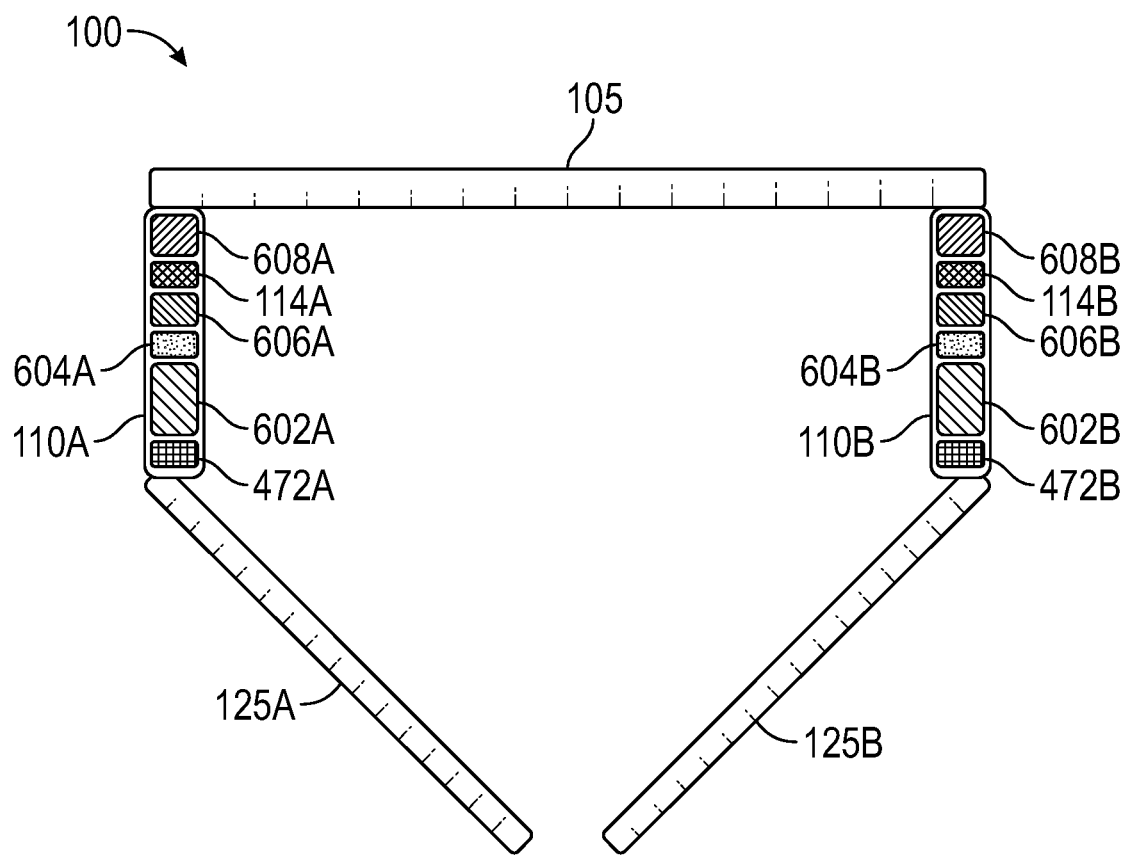
FIG. 6 is a partial block diagram of an eyewear device with a first system-on-chip adjacent one temple and a second system-on-chip adjacent the other temple.

FIG. 6 is a partial block diagram of an eyewear device 100 incorporating a first SoC 602A and a second SoC 602B in accordance with one example. The first SoC 602A is positioned within a left temple portion 110A along with a memory 604A (e.g., flash memory), a battery 606A, an IMU 472A, a camera 114A, and display components 608A. The second SoC 602B is positioned within a right temple portion 110B along with a memory 604B (e.g., flash memory), a battery 606B, an IMU 472B, a camera 114B, and display components 608B. The first SoC 602A is coupled to the second SoC via a communications bus within frame 105 for communications therebetween.

Although illustrated in the left temple portion 110A, one or more of the first SoC 602A, memory 604A, battery 606A, and display components 608A may be positioned in the frame 105 adjacent the left temple portion 110A (i.e., on the left lateral side 170A) or in the temple 125A. Additionally, although illustrated in the right temple portion 110B, one or more of the second SoC 602B, memory 604B, battery 606B, and display components 608B may be positioned in the frame 105 adjacent the right temple portion 110B (i.e., on the right lateral side 170B) or the temple 125B. Furthermore, although two memories 604A, B, batteries 606A, B, and display components 608A, B are illustrated, fewer or more memories, batteries, and display components may be incorporated. For example, a single battery 606 may power both SoCs 602A, B and SoCs 602A, B may access three or more memories 604 for performing various operations.

In one example, both SoCs 602 incorporate the same or substantially similar components and component layouts. Thus, their total processing resources are equivalent. In accordance with this example, the first SoC 602A is at least substantially identical to the second SoC (i.e., they are identical or have an overlap is components or processing resources of 95% or greater). Through the use of dual SoCs 602 (one positioned on one side of the eyewear device 100 and the other on the other side of the eyewear device) cooling is effectively distributed throughout the eyewear device 100 with one side of the eyewear device providing passive cooling for one SoC 602 and the other side of the eyewear device providing passive cooling for the other SoC 602.

In one example, the eyewear device 100 has a thermal passive cooling capacity per temple of approximately 3 Watts. The display 608 on each side (e.g., a projection LED display) utilizes approximately 1-2 Watts. Each SoC 602 is designed to operate at less than approximately 1.5 Watts (e.g., 800-1000 mW; unlike the approximately 5 Watts typically used for an SoC in a mobile phone), which enables suitable cooling of the electronics on each side of the eyewear device 105 utilizing passive cooling through the frame 105, temple portions 110A, temples 125A, or a combination thereof. By incorporating two SoCs 602 (positioned on opposite sides of the eyewear device 100 to take advantage of the unique passive cooling capacity presented by the eyewear device 100), computational power meeting or exceeding that available in a conventional mobile device (which utilizes an SoC operating at 5 Watts of power dissipated) is achievable.

Incorporating the same or similar components and component layouts in each SoC enables flexibility in distributing processing workload between the two SoCs 602. In one example, processing workload is distributed based on adjacent components. In accordance with this example, each SoC may drive a respective camera and a display, which may be desirable from an electrical standpoint. In another example, processing workload is distributed based on functionality. In accordance with this example, one SoC 602 may act as a sensor hub (e.g., do all computer vision, CV, and machine learning, ML, processing plus video encoding) and the other SoC 602 may run application logic, audio and video rendering functions, and communications (e.g., WI-FI®, BLUETOOTH®, 4G/5G, etc.). Distributing processing workload based on functionality may be desirable from a privacy perspective. For example, processing sensor information with one SoC and WI-F® with the other enables an implementation where private data such as camera images may be prevented from leaving the eyewear device unnoticed by not allowing such sensor information to be sent from the SoC doing sensor processing to the SoC managing communications. In another example, as described in further detail below, processing workload can be shifted based on SoC temperature, instructions per second, of the like.

Figure 7:
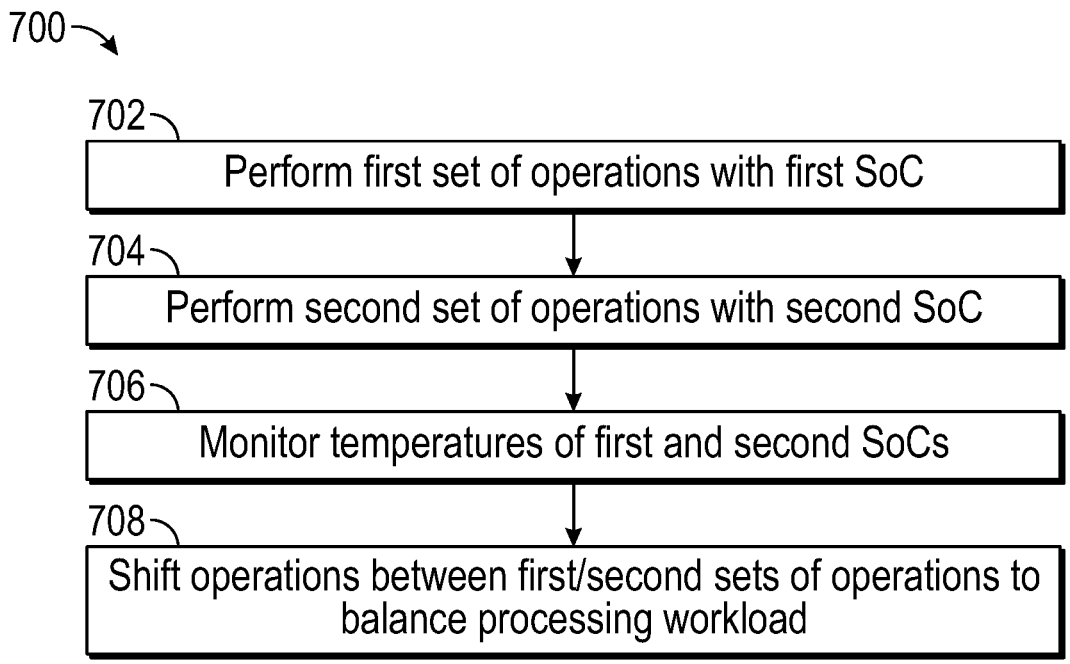
FIG. 7 is a flowchart of example steps for performing operations on eyewear with a first system-on-chip and a second system-on-chip.
Figure 8:
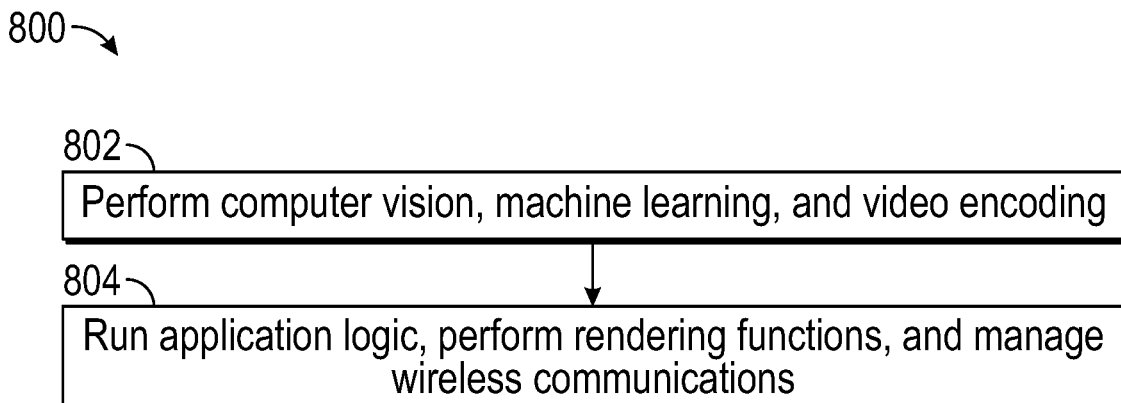
FIG. 8 is a flowchart of example steps for a method of balancing processing workloads on an eyewear device between a first system-on-chip and a second system-on-chip.
Figure 9:
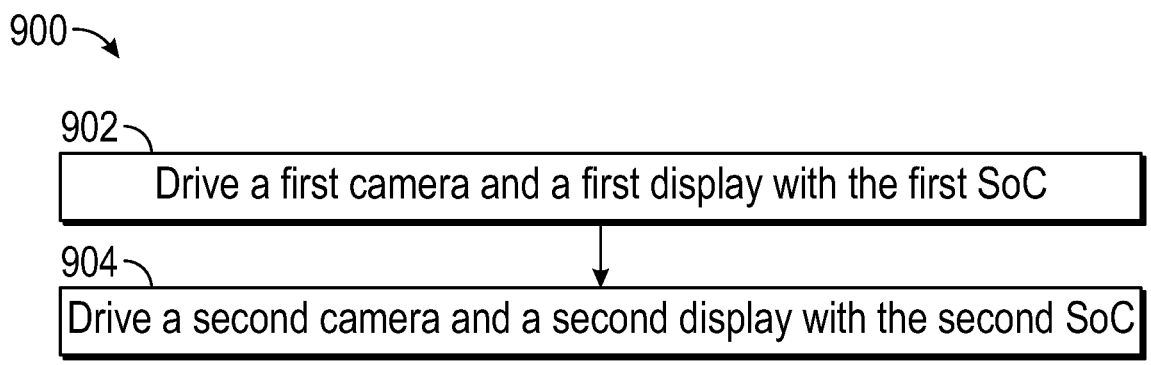
FIG. 9 is a flowchart of example steps for another method of balancing processing workloads on an eyewear device between a first system-on-chip and a second system-on-chip.

FIGS. 7-9 illustrate flowcharts 700/800/900 for implementing dual SoCs in an eyewear device in sample configurations. Although the steps are described with reference to eyewear device 100, other suitable eyewear devices in which one or more steps of the flowcharts 700/800/900 can be practiced will be understood by one of skill in the art from the description herein. Additionally, it is contemplated that one or more of the steps shown in FIGS. 7-9, and described herein may be omitted, performed simultaneously or in series, performed in an order other than illustrated and described, or performed in conjunction with additional steps.

FIG. 7 is a flowchart 700 of example steps for performing operations on eyewear with a first SoC and a second SoC. At block 702, a first SoC (e.g., SoC 602A) performs a first set of operations. At block 704, a second SoC (e.g., SoC 602B) perform a second set of operations. The first and second sets of operations may be distributed therebetween for performance on the respective SoC based on adjacent components, functionality, current workload processing (e.g., as determined based on temperature as described in the example steps of flow chart 700 or instructions per second), or a combination thereof.

At block 706, the eyewear device 100 monitors temperatures of the first and second SoCs. In one example, each SoC includes an integrated thermistor for measuring temperature. In accordance with this example, one SoC may be designated as a primary SoC and the other SoC may be designated as a replica SoC. The primary SoC may monitor its own temperature via a respective integrated thermistor and may monitor the temperature of the replica SoC by periodically requesting temperature readings from the replica SoC (which monitor its own temperature via a respective integrated thermistor).

At block 708, the eyewear device 100 shifts processing workloads between the first and second sets of operations performed on respective SoC to balance temperature (which effective distributes processing workload). In examples including a primary SoC and a replica SoC, the primary SoC manages the assignments of workloads to itself and to the replica SoC to maintain a relatively even distribution between the SoCs. In one example, when one of the SoC has a temperature that is above 10% of the temperature of the other SoC, the primary SoC reallocates processing workload from the SoC with the higher temperature to the SoC with the lower temperature until the temperature different is less than 5%. Processing instructions performed by each of the SoC may be assigned assignability values from 1 to 10 with 1 never being assignable and 10 always being assignable. When shifting processing workloads, the primary SoC may initially shift instructions with assignability values of 10, then 9, 8, etc. The steps for blocks 706 and 708 are continuously repeated to maintain even thermal distribution.

FIG. 8 is a flowchart 800 of example steps of a method for balancing processing workloads on an eyewear device between a first SoC and a second SoC. At block 802, a first SoC performs computer vision, machine learning, and video encoding. At block 804, a second SoC runs application logic, perform rendering functions, and manage wireless communications.

FIG. 9 is a flowchart 900 of example steps of another method of balancing processing workloads on an eyewear device between a first SoC and a second SoC. At block 902, the first SoC drives a first camera and a first display. At block 904, a second SoC drives a second camera and a second display.

Figure 10A:
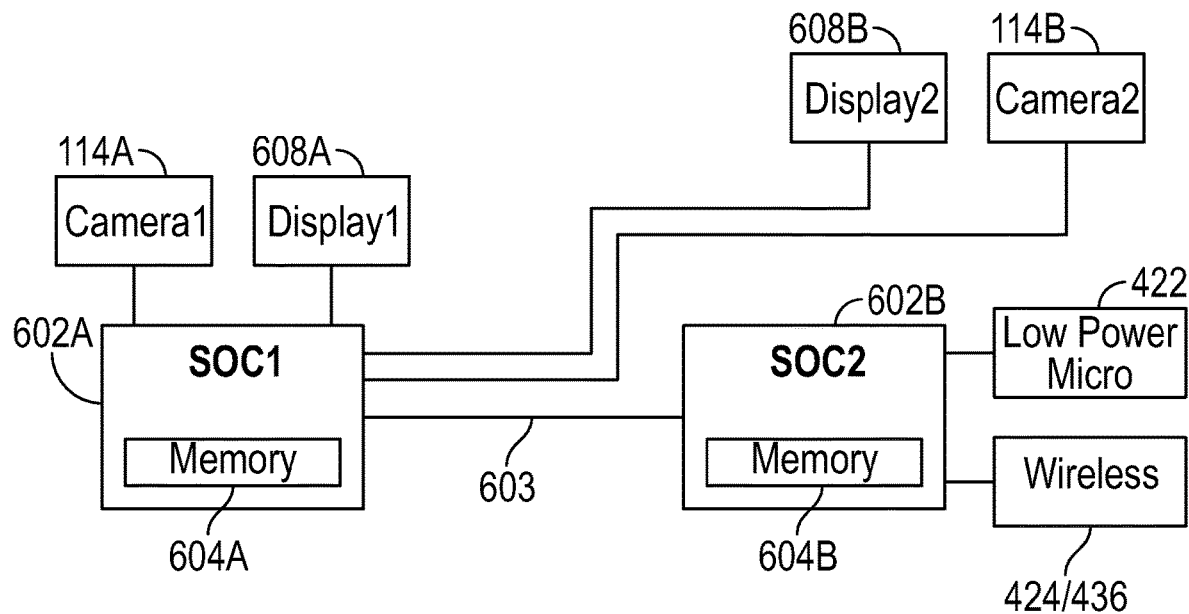
FIGS. 10A, 10B, and 10C depict three respective strategies for dividing processing workload between a first system-on-chip and a second system-on-chip.

FIG. 10A depicts a strategy for dividing processing workload between a first SoC 602A and a second SoC 602B of an eyewear device 100. This strategy balances power from a first side of the eyewear device 100 (e.g., left) to a second side of the eyewear device 100 (e.g., right), reduces interconnect complexity (e.g., with wireless subsystem managed by the second SoC 602B), and can be dynamically allocated between the left and right based on thermal load, processing requirements, or a combination thereof.

The first SoC 602A is connected to the second SoC 602B, e.g., by an inter-processor communication bus 603 such as PCI Express, SDIO, USB, etc. Communication with each SoC and between the SoCs are in accordance with an inter-process communication (IPC) protocol. A first memory 604A is incorporated into the first SoC 602A and a second memory 604B is incorporate into the second SoC 602B. In the illustrated example, a first camera 114A, a second camera 114B, a first display 608A, and a second display 608B of the eyewear device are coupled directly to the first SoC 602A. The second SoC 602B is coupled to a low power microprocessor 422 and to wireless circuitry 424/436.

In sample configurations, each SoC 602A and 602B operates at approximately 1.5 Watt or less (e.g., 800-850 mW). In one example, the first SoC 602A is responsible for running an operating system (OS) on a CPU (100 mW), capturing images with an ISP/DSP (200 mW), rendering still and video images on a graphics processing unit (GPU) (200 mW), and running various algorithms on the CPU, dedicated hardware accelerated logic blocks (e.g., a disparity mapper), and the digital signal processor (DSP) (350 mW) for a total of 850 mW of power allocated to the first side of the eyewear device. On the other hand, the second SoC 602B may be responsible for running an OS on a CPU (100 mW), wireless connectivity using the CPU (100 mW), running various algorithms on the CPU and a DSP (300 mW), and running various algorithms on the CPU, a GPU, and the DSP (300 mW) for a total of 800 mW of power allocated to the second side of the eyewear device. This implementation is well below the target of approximately 2-3 W of passive thermal distribution per side of the eyewear device 100.

Figure 10B:
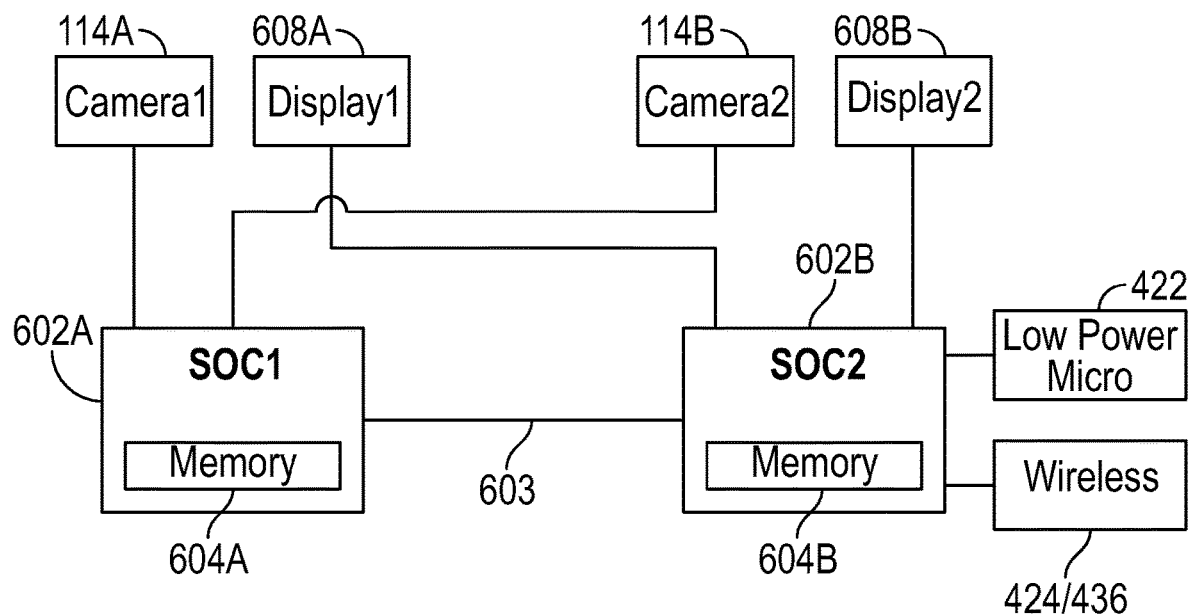

FIG. 10B depicts a split image capture and rendering strategy for dividing processing workload between a first SoC 602A and a second SoC 602B of an eyewear device 100. The first SoC 602A is coupled directly to the first and second cameras 114A, 114B and the second SoC 602B is coupled directly to the first and second displays 608A, B, the low power microprocessor 422 and the wireless circuitry 424/436. The first SoC 602A may be connected to the second SoC 602B by an inter-processor communication bus 603 such as PCI Express, SDIO, USB, etc., and power can be allocated dynamically between the left and right based on thermal load, processing requirements, or a combination thereof. This strategy includes a layer of security by coupling the cameras 114A, 114B directly to a first SoC 602A and not directly to the second SoC 602B or the wireless circuitry 424/436.

Each SoC operates at approximately 1.5 Watts or less (e.g., 950-1000 mW). In one example, the first SoC 602A is responsible for running an OS on a CPU (100 mW), capturing images with an ISP/DSP (200 mW), various algorithms on the CPU, dedicated hardware accelerated logic blocks (e.g., a disparity mapper), and the DSP (350 mW), and running various algorithms on the CPU, a GPU, and the DSP (300 mW) for a total of 950 mW of power allocated to the first side of the eyewear device. The second SoC 602B is responsible for running an OS on a CPU (100 mW), wireless connectivity using the CPU (100 mW), rending images on the GPU (200 mW), running various algorithms on the CPU and a DSP (300 mW), and running various algorithms on the CPU, the GPU, and the DSP (300 mW) for a total of 1000 mW of power allocated to the second side of the eyewear device. This implementation is well below the target of approximately 2-3 W of passive thermal distribution per side of the eyewear device 100.

Figure 10C:
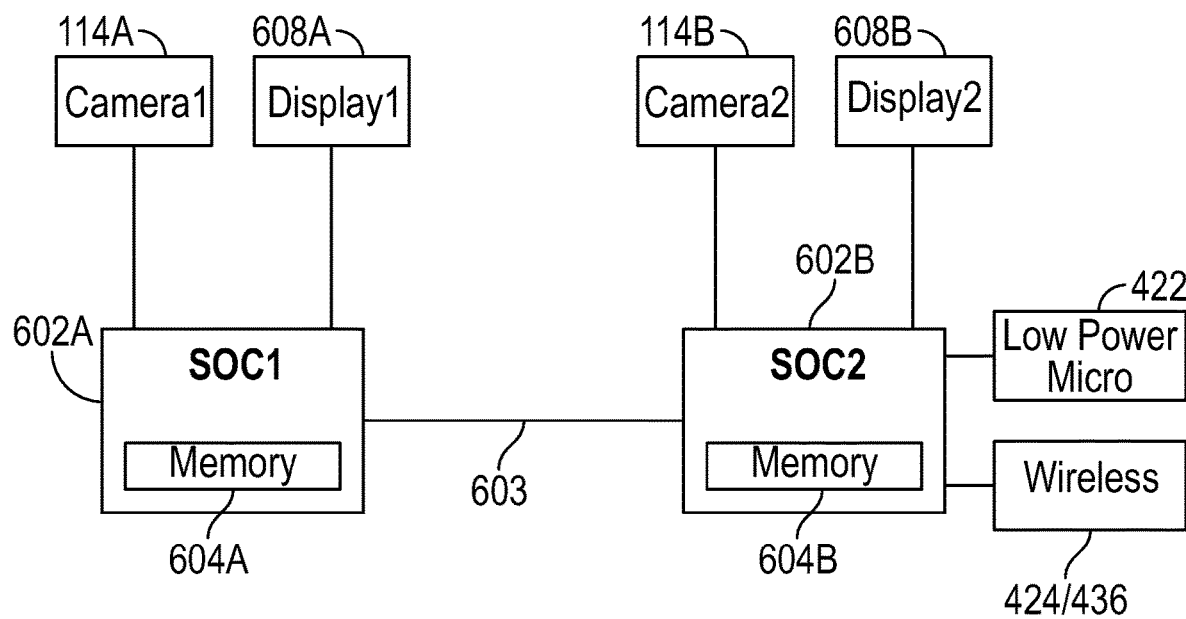

FIG. 10C depicts a left-right component strategy for dividing processing workload between a first SoC 602A and a second SoC 602B of an eyewear device 100. The first SoC 602A is coupled directly to the first camera 114A and the first display 608A and the second SoC 602B is coupled directly to the second camera 114B and the second display 608B, the low power microprocessor 422 and the wireless circuitry 424/436. The first SoC 602A may be connected to the second SoC 602B by an inter-processor communication bus 603 such as PCI Express, SDIO, USB, etc., and power can be allocated dynamically between the left and right based on thermal load, processing requirements, or a combination thereof.

Each SoC operates at approximately 1.5 Watts or (e.g., 950-1000 mW). In one example, the first SoC 602A is responsible for running an OS on a CPU (100 mW), capturing images with an ISP/DSP (100 mW), rending images on the GPU (100 mW), various algorithms on the CPU, dedicated hardware accelerated logic blocks (e.g., a disparity mapper), and the DSP (350 mW), and running various algorithms on the CPU, the GPU, and the DSP (300 mW) for a total of 950 mW of power allocated to the first side of the eyewear device. The second SoC 602B is responsible for running an OS on a CPU (100 mW), wireless connectivity using the CPU (100 mW), capturing images with an ISP/DSP (100 mW), rending images on the GPU (100 mW), running various algorithms on the CPU and a DSP (300 mW), and running various algorithms on the CPU, the GPU, and the DSP (300 mW) for a total of 1000 mW of power allocated to the second side of the eyewear device. This implementation is well below the target of approximately 2-3 W of passive thermal distribution per side of the eyewear device 100.

Figure 11:
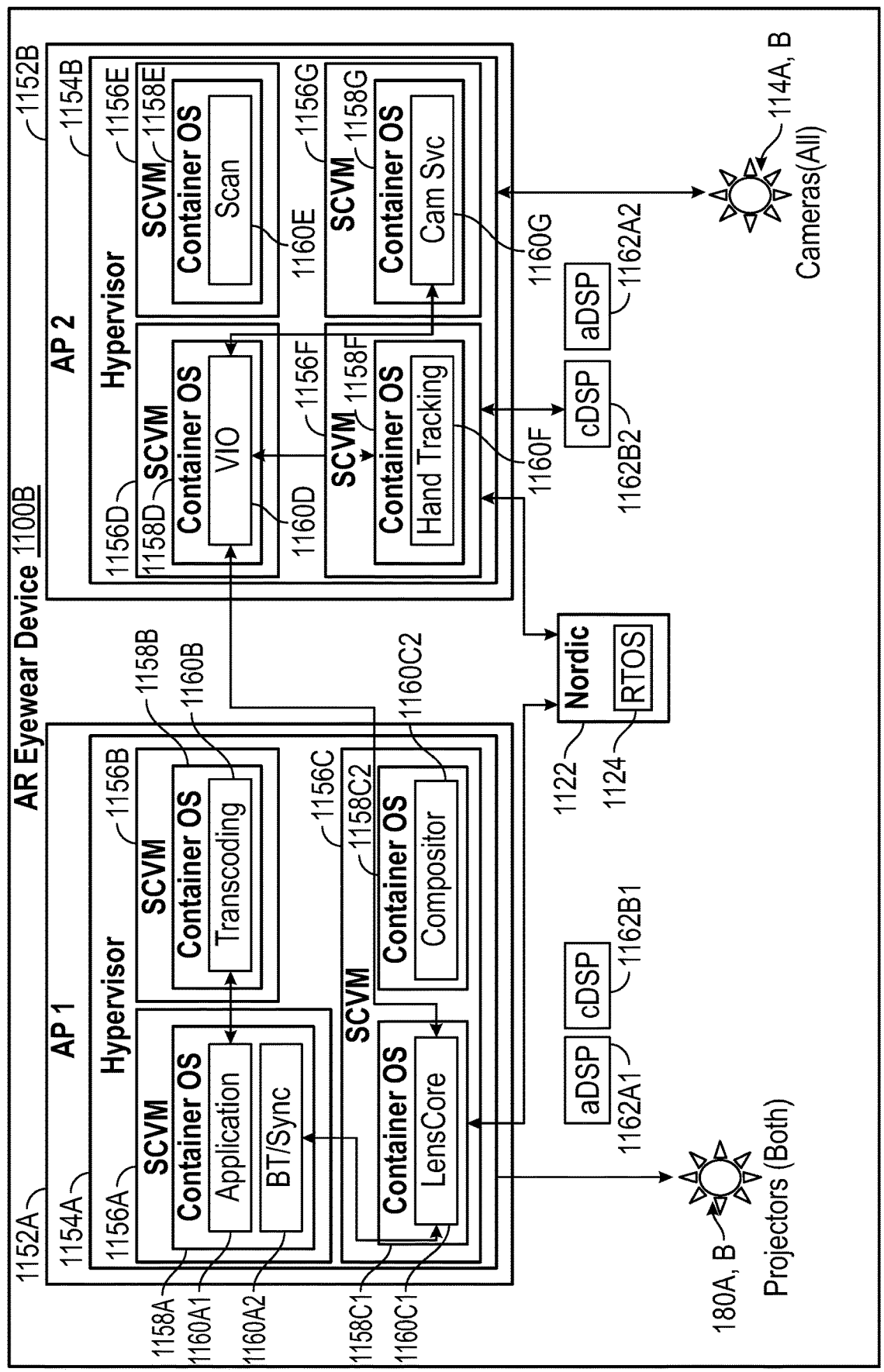
FIG. 11 is a block diagram illustrating an augmented reality headset with a virtual machine operating system.

FIG. 11 depicts an example of a containerized OS implemented on a computing system 1100B for use in an electronic device (e.g., an AR eyewear device in the illustrated example). Unlike traditional OSs, the containerized OS coordinates services instead of processes. The computing system 1100B includes a first processing system AP1 (first application processor 1152A such as a first SoC described herein) and a second processing system AP2 (second application processor 1152B such as a second SoC described herein). Although this example is described with reference to a processing system having two application processors 1152A, 1152B, one of skill in the art will understand how to apply the containerized OS approach to systems with more (e.g., four) or fewer (e.g., one) processing systems. Although the example containerized OS depicted in FIG. 11 and described herein utilizes a hypervisor as a system isolation manager for supporting isolation and communication between virtual machines, one of skill in the art will understand how to implement isolation and communication using a system isolation manager for supporting isolation and communication at a container level using a container manager such as Docker available from Docker, Inc. of Palo Alto, Calif., USA.

Each application processor 1152A, 1152B may include a respective hypervisor 1154 (e.g., hypervisor 1154A running on application processor 1152A and hypervisor 1154B running on application processor 1152B). In an example, hypervisor 1154A and hypervisor 1154B are at least substantially identical so that a SCVM can run on the hypervisor 1154 on either application processor 1152. In an example, the hypervisor 1154 is configured to start (spawn) and stop each SCVM, delegate peripheral access to the SCVMs, arbitrate access to shared resources, enforce bandwidth limits for access to the shared resources, or a combination thereof One or more SCVMs 1156 run on the hypervisor 1154 of a respective application processor 1152. Each SCVM 1156 includes its own OS and is configured to provide at least one service. Additionally, a supervisor OS (not shown) may run on each of the hypervisors 1154.

In the illustrated example, on the first application processor 1152A, a first SCVM 1156A includes an OS 1158A and is configured to provide an application service 1160A1 (e.g., a social media application) and a BLUETOOTH® synchronization service 1160A2. A second SCVM 1156B includes an OS 1158B and is configured to provide a transcoding service 1160B. A third SCVM 1156C includes a first OS 1158C1 that is configured to provide a lens core service 1160C1 and a second OS 1158C2 that is configured to provide a compositor service 1160C2. Where a SCVM provides more than one service, a kernel is shared by the containers providing those services for managing processing by the containers on the SCVM.

On the second application processor 1152B, a fourth SCVM 1156D includes an OS 1158D and is configured to provide a video input/output (VIO) service 1160D. A fifth SCVM 1156E includes an OS 1158E and is configured to provide a scanning service 1160E. A sixth SCVM 1156F includes an OS 1158F and is configured to provide a handtracking service 1160F. A seventh SCVM 1156G includes an OS 1158G and is configured to provide a camera service 1160G.

In one example, each SCVM includes at least one resource budget (not shown). The resource budget specifies the maximum amount of a particular resource the SCVM can request/utilize. Example resources include, by way of non-limiting example, allocation of memory 434, bandwidth of processor 432, etc. (e.g., reserve 200 MB of RAM to VIO service use, no overcommit at the service level 5, guarantee CPU, memory, network, and I/O bandwidth.

In examples where each SCVM includes two or more resource budgets, the SCVM may select the appropriate resource budget (e.g., responsive to the current mode of operation of the electronic device or application processors). For example, one of the modes of operation may be for an image acquisition mode (in which the camera service 1160G and VIO service 1160D require more resources) and another mode of operation may be for an image rendering mode (in which the lens core service 1160C1 and the compositor service 1160C2 require more resources).

The services 1160A2 and 1160B-F provide services that support and enable functions of the application service 1160A1. The application processor 1152 may be associated with one or more digital signal processors (e.g., application processor 1152A is associated with aDSP 1162A1 and cDSP 1162B1 and application processor 1152B is associated with aDSP 1162A2 and cDSP 1162B2). The scan service 1160E coordinates access to hardware resources such as the digital signal processors (e.g., aDSP 1162A2 and cDSP 1162B2). The application service 1160A1 receives images from cameras 114A, 114B (e.g., via camera service 1160G) and presents images via projectors 180A, 180B (e.g., via lens core service 1160C1 and compositor service 1160C2).

The computer system 1100B may additionally include a communication coprocessor 1122 having a real-time OS 1124 such as a coprocessor available from Nordic Semiconductor, Inc. of Cupertino, Calif., USA.

The components/services communicate with one another (inter-application processor and intra-application processor) using an IPC protocol supported by the supervisor OS and the OSs 1158. The IPC protocol abstracts over the physical location of each service. In other words, from the perspective of a service, an IPC call works the same way whether a callee resides on the caller's SoC, a different SoC, or a coprocessor peer like a Nordic unit or a Snapdragon xDSP unit.

In one example, the IPC protocol is a data interchange format protocol such as Cap'n Proto available from sandstorm.io, protobuf, or other data exchange format. A subset of connections is illustrated in FIG. 11; however, essentially any service/component can communicate with any other service/component using the IPC protocol. In addition to inter-application processor/SoC and intra-application processor/SoC, services can communicate with other resources (e.g., aDSP 1162A, cDSP 1162B, and Nordic 1122) by sending messages utilizing the IPC protocol.

Figure 12A:
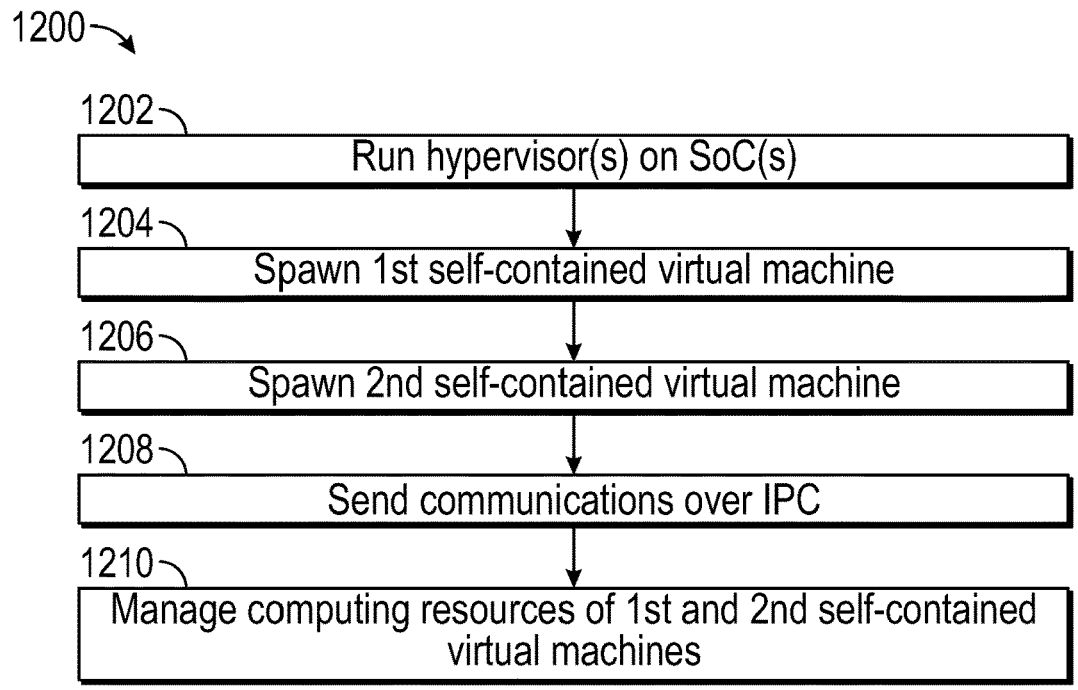
FIGS. 12A, 12B, and 12C are flowcharts of example steps performed by a virtual machine operating system.
Figure 12B:
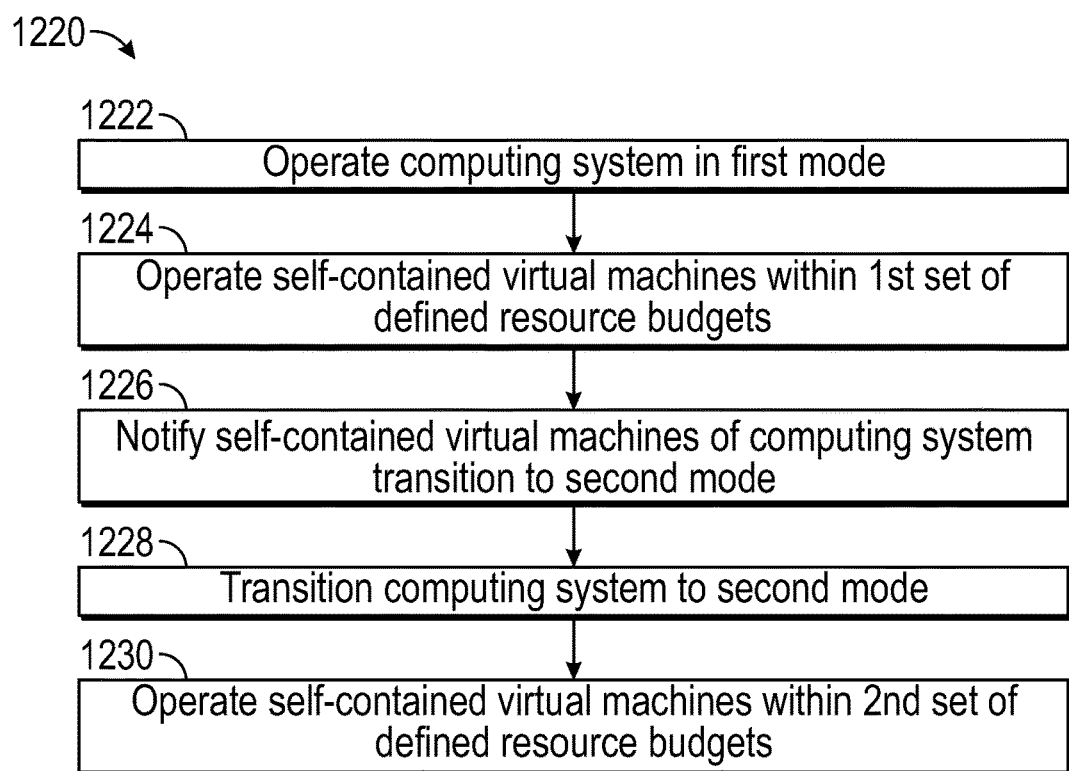
Figure 12C:
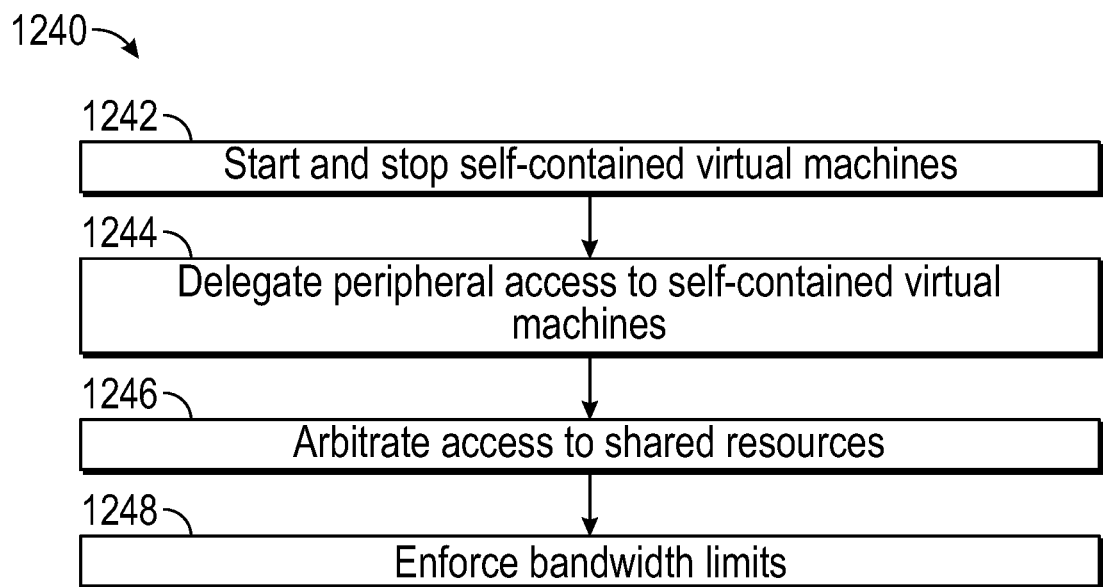
Figure 13:
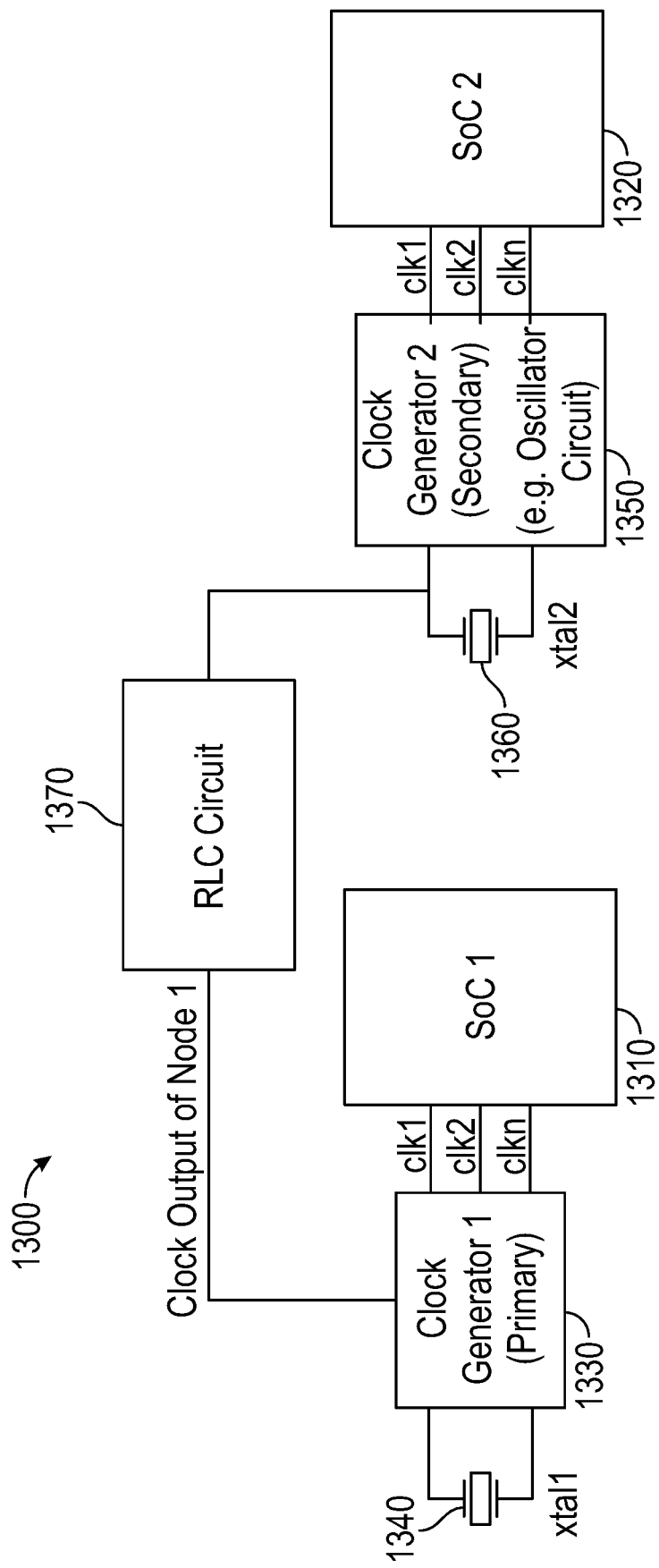
FIG. 13 illustrates a circuit configuration for synchronizing the timing of nodes having independent time bases by injecting current pulses generated from the clock generator circuit of a primary node into the clock generator circuit of a secondary node.

FIGS. 12A-12C include flowcharts 1200/1220/1240 for implementing an OS on a processing system of computing devices such as a single SoC or dual SoCs in a computing device, e.g., an eyewear device of the type described above. Although the steps are described with reference to eyewear device 100, other suitable devices in which one or more steps of the flowcharts 1200/1220/1240 can be implemented will be understood by one of skill in the art from the description herein. Additionally, it is contemplated that one or more of the steps shown in FIGS. 12A-12C, and described herein, may be omitted, performed simultaneously or in series, performed in an order other than illustrated and described, or performed in conjunction with additional steps. Furthermore, although the example methods depicted in FIGS. 12A-12C and described herein utilize a hypervisor as a system isolation manager for supporting isolation and communication between virtual machines, one of skill in the art will understand how to implement isolation and communication using a system isolation manager for supporting isolation and communication at a container level using a container manager such as Docker available from Docker, Inc. of Palo Alto, Calif., USA.

FIG. 12A is a flowchart 1200 of example steps for performing operations on a computing system implemented as a SoC. At block 1202, a processing system runs a hypervisor. The hypervisor has a supervisor OS. The hypervisor runs on each of at least one processing system where each processing system may be implemented as one or more SoCs (e.g., on each of first SoC 602A and second SoC 602B).

At block 1204, the hypervisor spawns a first SCVM having a first OS configured to run on the hypervisor. The first SCVM is configured to provide a first service (e.g., an application service). In one example, the first SCVM includes a first container and the first service runs in the first container. In one example, the hypervisor is configured to spawn particular SCVMs/services on particulars SoCs. In other examples, the hypervisor is configured to dynamically spawn the SCVMs on the SoCs, e.g., to distribute processing and balance thermal loads. Where the at least one processor is one or more SoCs, a SoC spawns the first SCVM.

At block 1206, the hypervisor spawns a second SCVM having a second OS configured to run on the hypervisor. The second SCVM is configured to provide a second service (e.g., a compositor service). In one example, the second SCVM includes a second container and the second service runs in the second container. Where the at least one processor is one or more SoCs, a SoC spawns the second SCVM.

At block 1208, the first SCVM communicates with the second SCVM. The SCVMs communicate with one another via an IPC protocol supported by the supervisor OS of the hypervisor, the first OS, and the second OS. Additionally, the SCVMs may communication with other components/resources.

At block 1210, the computing system manages computing resources of the SCVMs. In an example, the computer system manages computing resources through the IPC protocol. For example, each SCVM may include a resource budget (which is allocated/planned for within the computing system). During operation, an SCVM monitors its resource budget and only requests resources from the computing system (via the IPC protocol) if within the resource budget. The computing system schedules requested services (e.g., using a round-robin with priority levels scheme). In an example, the computing resources meet or exceed the combined resource budgets from all SCVMs. Since the SCVMs only requests resources within their resource budget, there will be adequate resources available to fulfil the requests of all SCVMs without the need to deny or restrict access to services.

In one example, services that interact with hardware exclusively (e.g., compositor service, camera services) are provided with direct access to that hardware via virtual machine (VM) pass-through, which removes the need for paravirtualization and device emulation overhead.

FIG. 12B is a flowchart 1220 of additional example steps for performing operations on a computing system implemented as a SoC. At block 1222, the computing system operates in a first mode (e.g., an image acquisition mode). In an example, the computing system has multiple operating modes and one or more (e.g., all) SCVMs have corresponding operating modes. The operating mode of each SCVM in accordance with this example has an associated defined resource budget (e.g., maintained in a lookup table accessible to the SCVM).

At block 1224, the SCVMs operate in the first mode. When in the first mode of operation, each SCVM utilizes resources within constraints imposed by the respective resource budget of that SCVM operating in that mode. The SCVMs may default to the first mode when spawned or the hypervisor may provide a communication to the SCVM (e.g., via IPC protocol) at the time of spawning identifying the first mode.

At block 1226, the computing system notifies the SCVMs that it is transitioning to a second mode (e.g., an image projection mode). When the computing system is changing from a first mode to a second mode, the computing system notifies the SCVMs of the transition (e.g., via IPC protocol) so they can prepare for the transition.

At block 1228, the computing system transitions to the second mode.

At block 1230, the SCVMs operate in the second mode. When in the second mode of operation, each SCVM utilizes resources within constraints imposed by the respective resource budget of that SCVM operating in that mode. The SCVMs may transition to operating in the second mode in response to a notification from the computing system (e.g., via IPC protocol) that it is transitioning to the second mode.

FIG. 12C is a flowchart 1240 of additional example steps for performing operations on a hypervisor. At block 1242, the hypervisor starts and stops the first SCVM and the second SCVM. In an example, the hypervisor starts and stops virtual machine services on nodes in an SoC on demand according to changes in configuration and device state. At block 1244, the hypervisor delegates peripheral access to the first SCVM and the second SCVM. At block 1246, the hypervisor arbitrates access to shared resources. At block 1248, the hypervisor enforces bandwidth limits for access to the shared resources.

While the respective application processors 1152 used to implement the functionality of the electronic eyewear device 100 described above with respect to FIGS. 1-12 are ideally physically separated to optimize passive thermal distribution, the operations of the respective processors may need to be closely integrated. In such multi-node systems, where a respective application processor constitutes each node, time-stamped data is often produced on one node and consumed on another one. Occasionally such data consists of multiple timestamped streams originating in different parts of the system and eventually fused together to produce a new data stream. In these scenarios it is important to ensure that the clocks used for timestamping of the respective data streams use the same time base. However, the respective application processors 1152, even if identical, are not guaranteed to have the same time base. For example, conventional SoCs may have their own oscillators driving the internal clock resulting in a small drift caused by variations in oscillator frequency. Also, the SoCs may turn on/off independently and may not be driven by the same clock generator circuit. For example, in the above configurations of the electronic eyewear device, the clock generator circuit would have to drive respective SoCs across the bridge of the electronic eyewear device 100, which is prohibited by the system layout and, in any case, the SoCs may not support external clock sources.

It is desired to provide a time synchronization technique including a simple passive RLC circuit that keeps the crystals of respective nodes, such as the SoCs described above, in sync for low power applications including, for example, AR applications implemented by electronic eyewear.

Generally, SoCs of the type described herein use separate crystals (called XTALs) as input to the system clock generators. These crystals resonate at specific frequencies, but the resonant frequency can be shifted slightly by injecting an external signal that is slightly different in frequency from the original resonant frequency or its harmonics or subharmonics. Such signal injection is called "pulling" of the crystal.

Those skilled in the art will appreciate that current may not be injected directly into the crystal itself but is injected into the clock generator circuit driven by the crystal. The external passive RLC circuit described herein is designed to "pull" the crystal of a clock generator of a secondary node into synchronization with the crystal of a clock generator of a primary node without requiring adjusting capacitors in the clock generator circuit. In this case, the external "pulling" signal is the clock output of a clock generator of the primary node and the pulled crystal is part of the clock generator of the secondary node. The external passive RLC circuit is employed to allow only current pulses to be injected into the clock generator of the secondary node. In a sample configuration, the clock generator of the secondary node includes a ring oscillator circuit that is tuned by the current pulses from the external passive RLC circuit. The external passive RLC circuit may include a divider (diode), a high pass filter (RLC), or a combination of both.

In a sample configuration, a ring oscillator of the clock generator of the secondary node uses an odd number of inverters to give the effect of a single inverting amplifier with a gain of greater than one. Rather than having a single delay element, each inverter contributes to the delay of the signal around the ring of inverters. Adding pairs of inverters to the ring increases the total delay and thereby decreases the oscillator frequency. Changing the supply voltage changes the delay through each inverter, with higher voltages typically decreasing the delay and increasing the oscillator frequency. Similarly, injecting current changes the delay through each inverter, thus changing the oscillator frequency. The changes in the oscillator frequency as a result of such current injection may be monitored in a feedback circuit such as a phase locked loop to assure that the oscillator frequency of the clock generator of the secondary node tracks the oscillator frequency of the clock generator of the primary node. The feedback circuit may monitor timestamps of the respective nodes to track the synchronization of the respective clock generators.

FIG. 13 illustrates a circuit configuration 1300 for synchronizing the timing of a first node (node1) 1310 and a second node (node2) 1320 having independent time bases respectively generated by a primary clock generator (clock generator 1) 1330 and a crystal (xtal 1) 1340 for driving the primary node (node 1) 1310 and by a secondary clock generator (clock generator 2) 1350 and a crystal (xtal2) 1360 for driving the secondary node (node 2) 1320. In the illustrated configuration, the clock output of clock generator 1 (1330) is provided to a passive RLC circuit 1370 that generates current pulses that are injected into clock generator 2 (1350) to pull the crystal 1360 of clock generator 2 (1350) into synchronization with clock generator 1 (1330). It will be appreciated that the respective nodes may be constituted by respective SoCs of the type described above and that each SoC will have its own crystal and clock generator circuit.

FIGS. 14A-14F illustrate sample configurations of the RLC circuit of FIG. 13 for generating current pulses for pulling the crystal 1360 of clock generator 2 (1350) into synchronization with clock generator 1 (1330). These RLC circuit options are not exhaustive but provided by way of example only. Those skilled in the art will appreciate which RLC circuit option is most appropriate for synchronizing the respective clock generators in sample configurations. Also, the primary clock generator 1330 is illustrated as including a ring oscillator circuit 1332, a plurality of clock dividers 1334 for each output clock (clk1, c1k2, ... clkn), and clock buffers 1336 for each output clock. Similarly, the secondary clock generator 1350 is illustrated as including a ring oscillator circuit 1352, a plurality of clock dividers 1354 for each output clock (clk1, c1k2, ... clkn), and clock buffers 1356 for each output clock. It will be appreciated by those skilled in the art that these clock generators are exemplary only and that other clock generator configurations may be used by those skilled in the art.

Figure 14A:
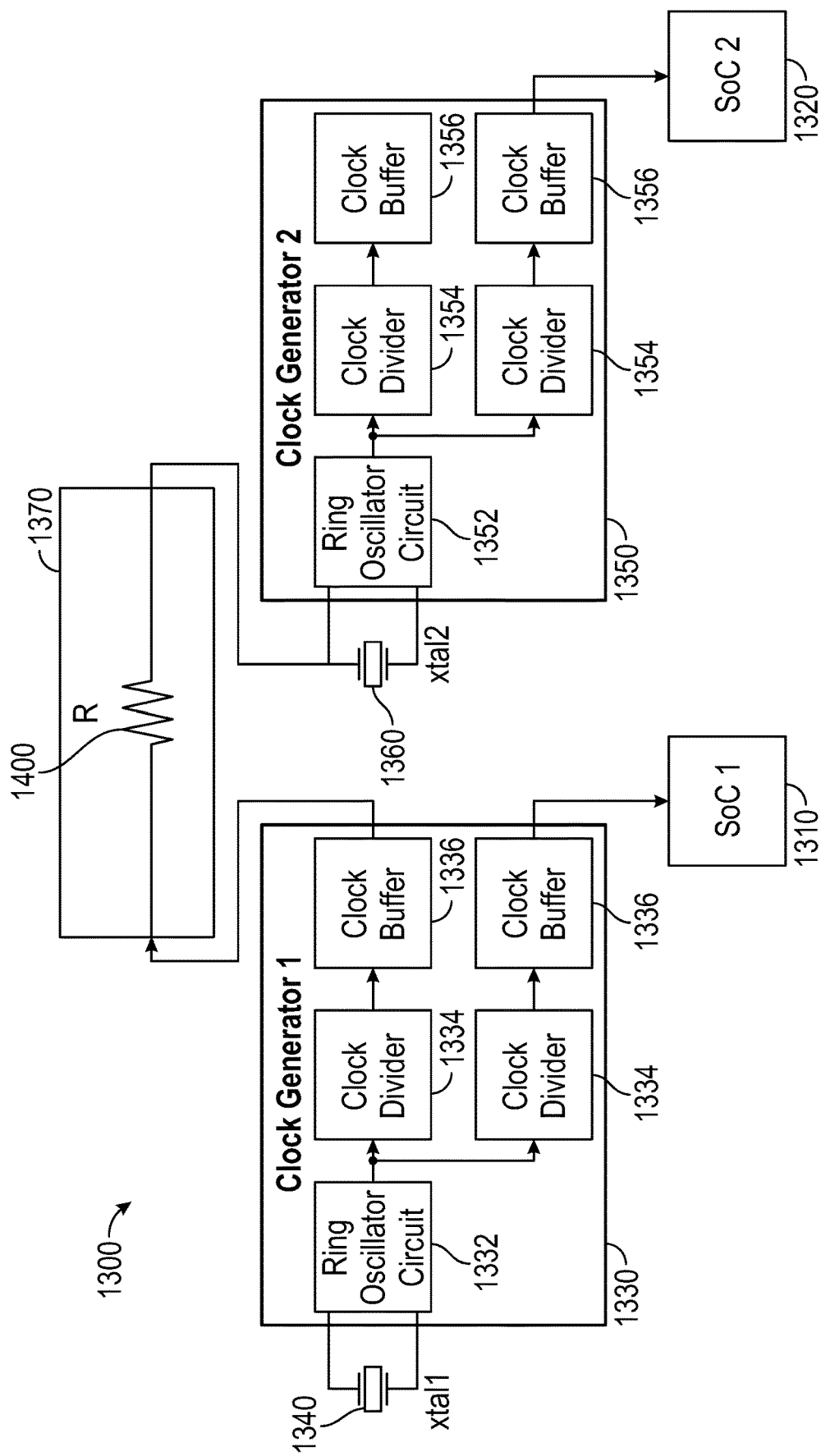
FIG. 14A illustrates a configuration of the RLC circuit of FIG. 13 including a resistor.

FIG. 14A illustrates a configuration of the RLC circuit of FIG. 13 including a resistor R (1400). Resistor 1400 converts the output voltage (V) of primary clock generator 1330 into a current I using Ohm's law (V=IR). The generated current pulses are then injected into the ring oscillator circuit 1352 of secondary clock generator 1350 to pull the frequency of secondary clock generator 1350 to the frequency of the primary clock generator 1330.

Figure 14B:
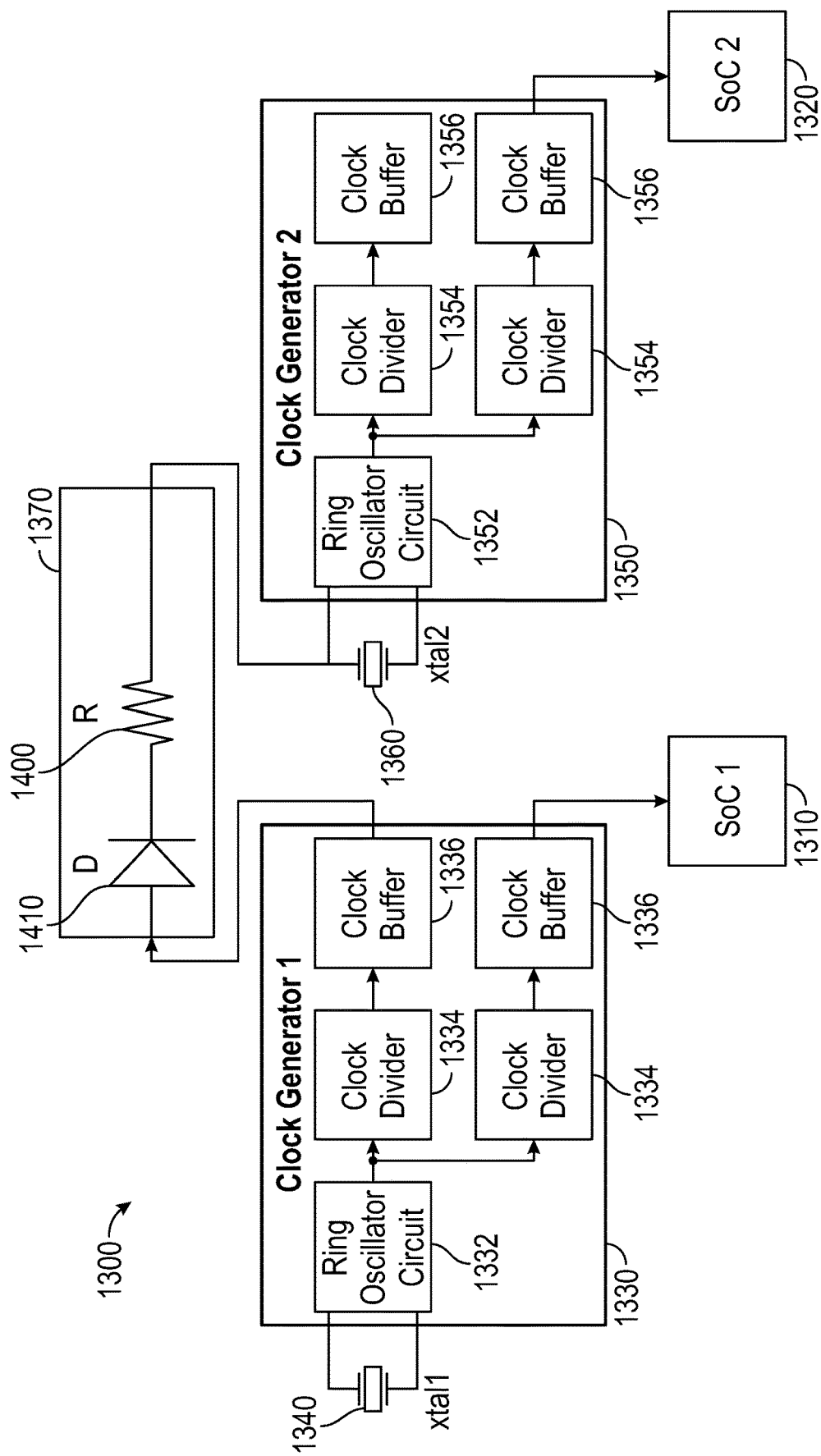
FIG. 14B illustrates a configuration of the RLC circuit of FIG. 13 including a diode and a resistor.

FIG. 14B illustrates a configuration of the RLC circuit of FIG. 13 including a series connected diode D (1410) and resistor R (1400). In this configuration, the diode 1410 and resistor 1400 generate harmonics of the output voltage of the primary clock generator 1330, and the resulting current pulses (multiple harmonics) are then injected into the ring oscillator circuit 1352 of secondary clock generator 1350 to pull the frequency of secondary clock generator 1350 to the frequency of the primary clock generator 1330.

Figure 14C:
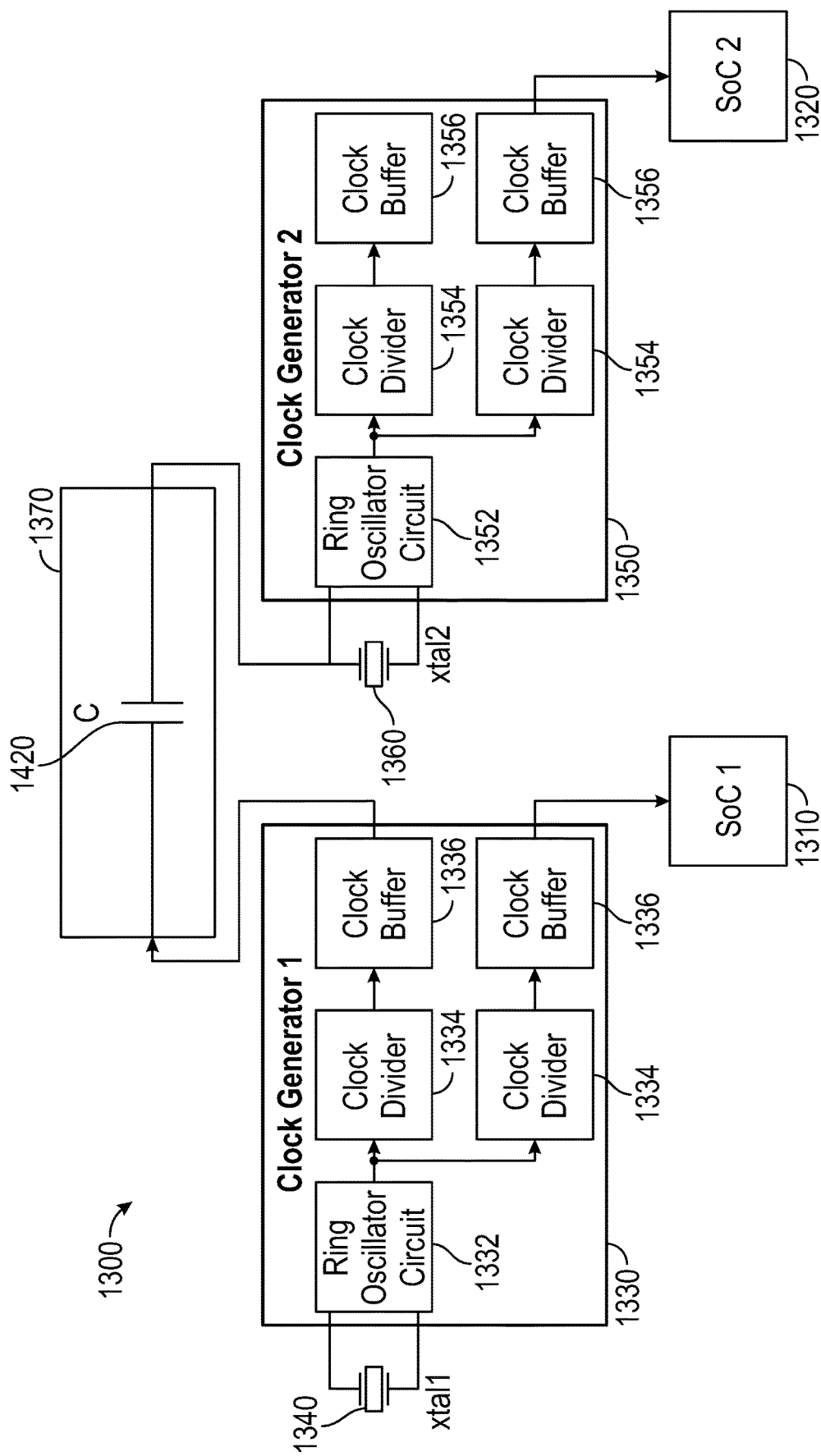
FIG. 14C illustrates a configuration of the RLC circuit of FIG. 13 including a capacitor.

FIG. 14C illustrates a configuration of the RLC circuit of FIG. 13 including a capacitor C (1420). Capacitor 1420 performs capacitive coupling and produces a positive current pulse on the rising edge and a negative current pulse on the negative edges of the received output voltage from the primary clock generator 1330. The resulting current pulses are then injected into the ring oscillator circuit 1352 of secondary clock generator 1350 to pull the frequency of secondary clock generator 1350 to the frequency of the primary clock generator 1330.

Figure 14D:
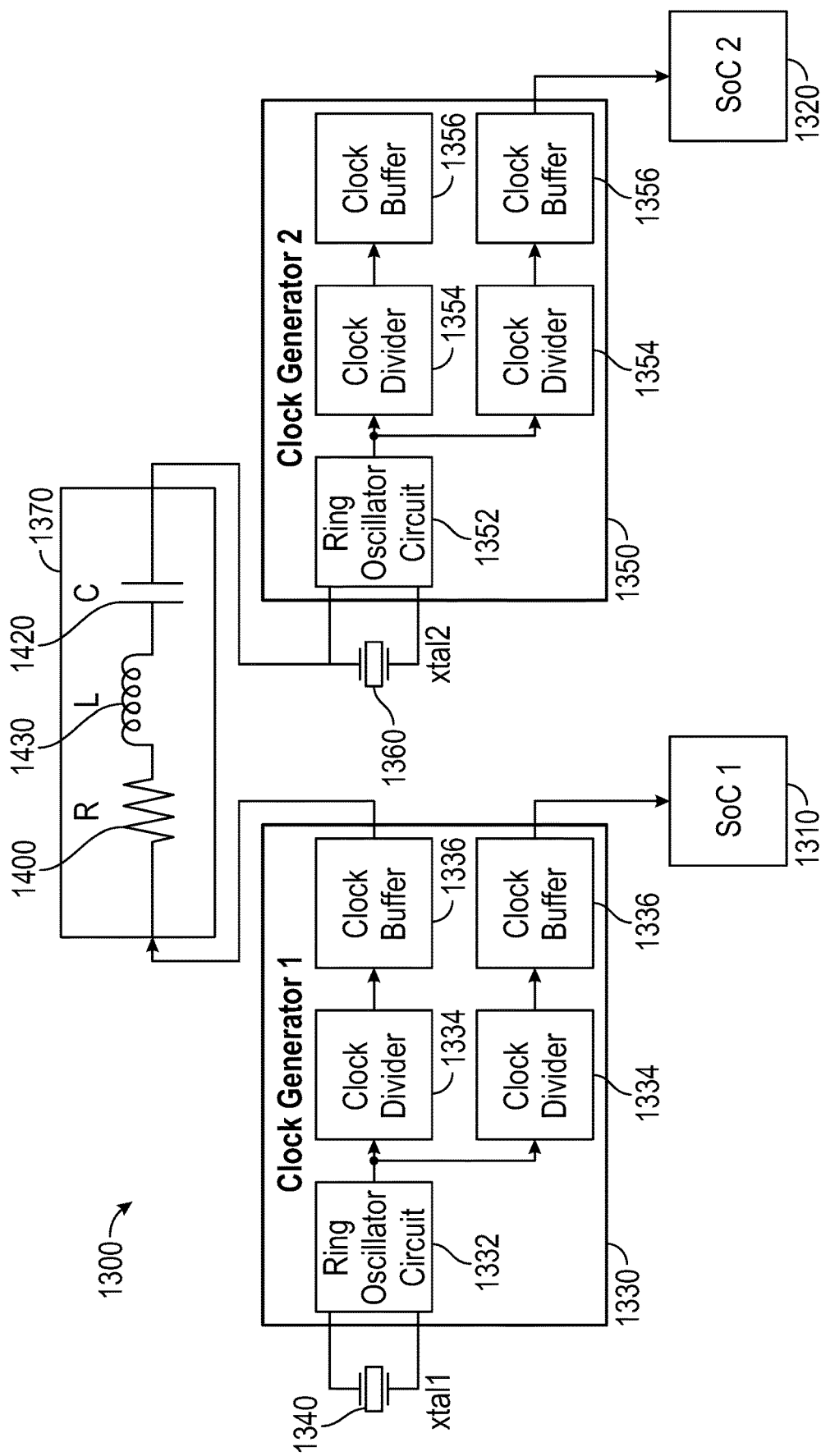
FIG. 14D illustrates a configuration of the RLC circuit of FIG. 13 including a resistor and a series LC tank circuit.

FIG. 14D illustrates a configuration of the RLC circuit of FIG. 13 including a resistor R (1400) and a series LC tank circuit including capacitor C (1420) and inductor L (1430). The resistor 1400 and series LC tank circuit convert the output voltage from the primary clock generator 1330 into current but only pass specific harmonics from the series LC tank circuit into the ring oscillator circuit 1352 of secondary clock generator 1350 to pull the frequency of secondary clock generator 1350 to the frequency of the primary clock generator 1330.

Figure 14E:
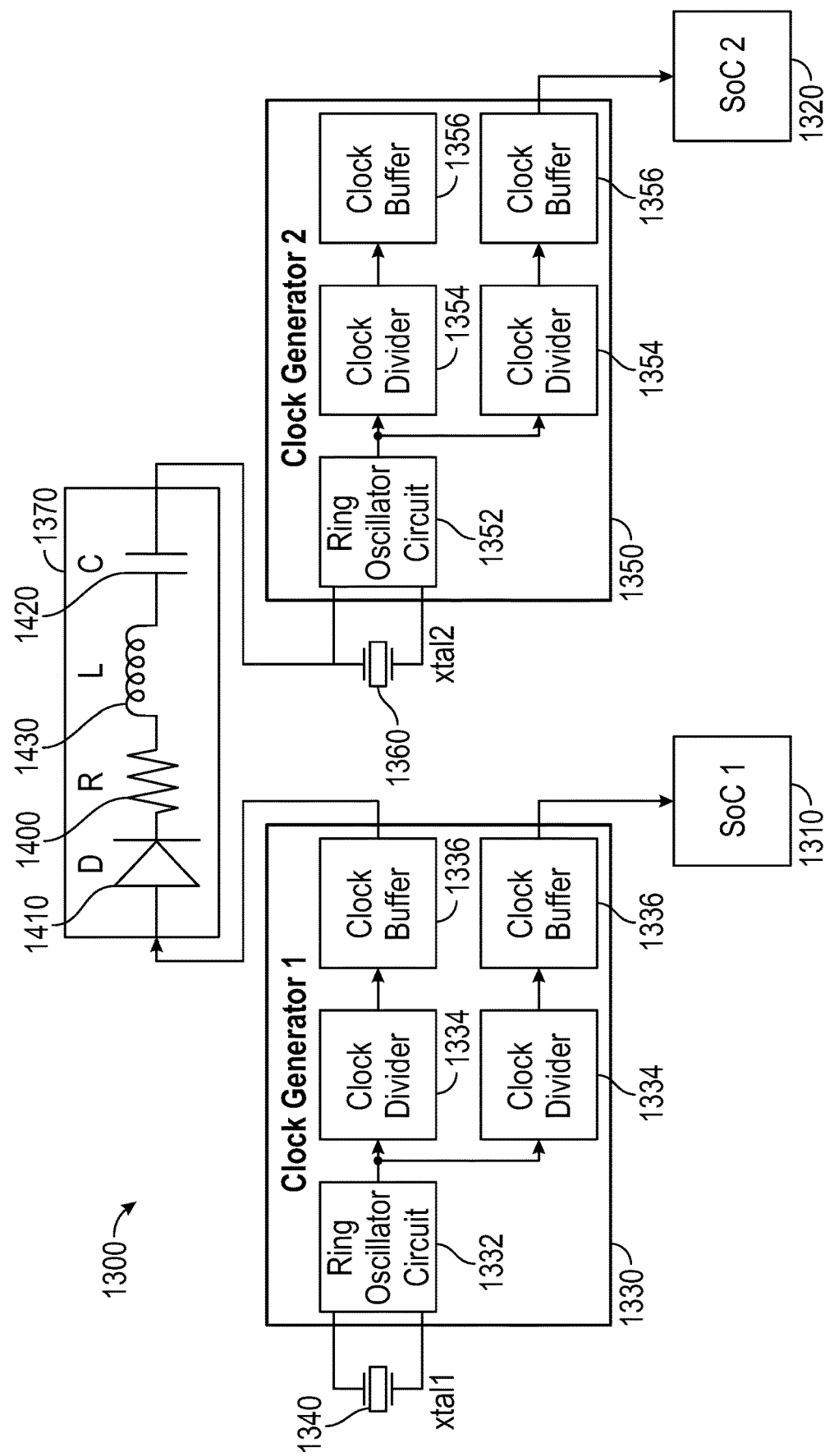
FIG. 14E illustrates a configuration of the RLC circuit of FIG. 13 including a diode, a resistor, and a series LC tank circuit.

FIG. 14E illustrates a configuration of the RLC circuit of FIG. 13 including a diode D (1410), a resistor R (1400), and a series LC tank circuit including capacitor C (1420) and inductor L (1430). This configuration uses a combination of the RLC options of FIGS. 14A-14D to inject specific harmonics of the primary clock generator 1330 into the ring oscillator circuit 1352 of secondary clock generator 1350 to pull the frequency of secondary clock generator 1350 to the frequency of the primary clock generator 1330.

Figure 14F:
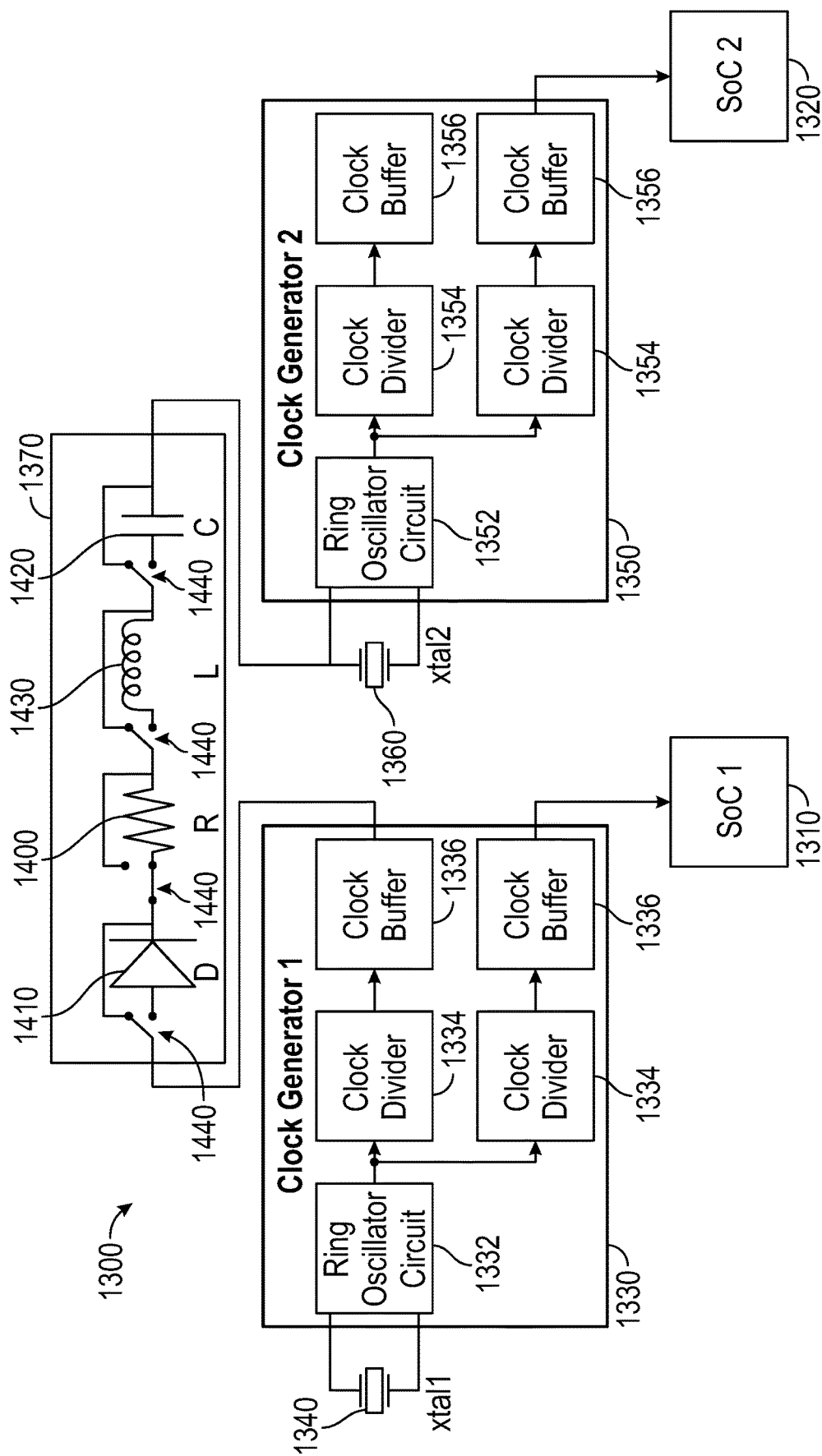
FIG. 14F illustrates a configuration of the RLC circuit of FIG. 14E further including switches.

Those skilled in the art will appreciate that other passive RLC circuit configurations may be used and that the RLC circuit options presented in FIGS. 14A-14E are not exhaustive. In a further sample configuration, the RLC circuit of FIG. 14E may further include switches 1440 as shown in FIG. 14F. As in FIG. 14F, the switches 1440 may be set such that resistor R (1400) is used as a default option. However, it will be further appreciated that the respective series connected circuit elements may be switched in or out of the RLC circuit 1370 by changing the settings of the switches 1440 between each of the RLC circuit elements shown in FIG. 14F to generate the respective configurations shown in FIGS. 14A-14E in accordance with the specific characteristics desired for the inserted current. Generally speaking, the resistor would be used to source the current waveform, while the diode would divide and the tank circuit would source harmonics.

Those skilled in the art will further appreciate that the frequency of the crystal 1360 of the secondary clock generator 1350 also may be shifted by adjusting the load capacitance and inductance. However, this approach requires tuning of the crystal 1360 in a narrow range using capacitors. Such elements can be integrated into the passive RLC circuit 1370 as desired. However, such a circuit is more complicated than the examples described above as a feedback circuit including a varactor may be needed to stabilize the circuit.

As used herein, the term "memory" refers to a machine-readable medium adapted to store data temporarily or permanently and may be taken to include, but not be limited to, random-access memory (RAM), read-only memory (ROM), buffer memory, flash memory, and cache memory. In an example system configuration, to be a single medium, the term "machine-readable medium" should be taken to include a single medium or multiple media (e.g., a centralized or distributed database, or associated caches and servers) able to store instructions for execution by one or more processors. The term "machine-readable medium" also shall be taken to include any medium, or combination of multiple media, that is capable of storing instructions for execution by a machine (e.g., one or more processors), such that the instructions, when executed by one or more processors of the machine, cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

Furthermore, any machine-readable medium is non-transitory (in other words, not having any transitory signals) in that it does not embody a propagating signal. However, labelling the machine-readable medium "non-transitory" should not be construed to mean that the medium is incapable of movement; the medium should be considered as being transportable from one physical location to another. Additionally, since the machine-readable medium is tangible, the medium may be considered to be a machine-readable device.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises or includes a list of elements or steps does not include only those elements or steps but may include other elements or steps not expressly listed or inherent to such process, method, article, or apparatus. An element preceded by "a" or "an" does not, without further constraints, preclude the existence of additional identical elements in the process, method, article, or apparatus that comprises the element.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various system configurations of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of system configurations of the present disclosure as represented by the appended claims. The specification and drawings are, accordingly, to be regarded in an illustrative rather than a restrictive sense.

Unless otherwise stated, any and all measurements, values, ratings, positions, magnitudes, sizes, and other specifications that are set forth in this specification, including in the claims that follow, are approximate, not exact. Such amounts are intended to have a reasonable range that is consistent with the functions to which they relate and with what is customary in the art to which they pertain. For example, unless expressly stated otherwise, a parameter value or the like may vary by as much as plus or minus ten percent from the stated amount or range.

In addition, in the foregoing Detailed Description, it can be seen that various features are grouped together in various examples for the purpose of streamlining the disclosure. This method of disclosure is not to be interpreted as reflecting an intention that the claimed examples require more features than are expressly recited in each claim. Rather, as the following claims reflect, the subject matter to be protected lies in less than all features of any single disclosed example. Thus, the following claims are hereby incorporated into the Detailed Description, with each claim standing on its own as a separately claimed subject matter.

While the foregoing has described what are considered to be the best mode and other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

The system configurations illustrated herein are described in sufficient detail to enable those skilled in the art to practice the teachings disclosed. Other system configurations may be used and derived therefrom, such that structural and logical substitutions and changes may be made without departing from the scope of this disclosure. The Detailed Description, therefore, is not to be taken in a limiting sense, and the scope of various system configurations is defined only by the appended claims, along with the full range of equivalents to which such claims are entitled.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

What is claimed is:
1. An electronic eyewear device comprising:
a first system-on-chip driven by a first clock generator;
a second system-on-chip driven by a second clock generator, where the first clock generator and the second clock generator have independent time bases; and a circuit external to the first clock generator and the second clock generator that converts an output of the first clock generator into current pulses and injects the current pulses into the second clock generator to pull an output of the second clock generator into synchronization with the output of the first clock generator.

2. The electronic eyewear device of claim 1, wherein the circuit external to the first clock generator and the second clock generator comprises a resistor that converts an output voltage of the first clock generator into the current pulses.

3. The electronic eyewear device of claim 1, wherein the circuit external to the first clock generator and the second clock generator comprises a series connected diode and resistor that generate harmonics of an output voltage of the first clock generator.

4. The electronic eyewear device of claim 1, wherein the circuit external to the first clock generator and the second clock generator comprises a capacitor that produces a positive current pulse on rising edges and a negative current pulse on negative edges of an output voltage of the first clock generator.

5. The electronic eyewear device of claim 1, wherein the circuit external to the first clock generator and the second clock generator comprises a series connected resistor and a series LC tank circuit that converts an output voltage of the first clock generator into the current pulses while passing only specific harmonics from the series LC tank circuit.

6. The electronic eyewear device of claim 1, wherein the circuit external to the first clock generator and the second clock generator comprises a series connected diode, resistor and a series LC tank circuit that generate specific harmonics of the output of the first clock generator.

7. The electronic eyewear device of claim 6, wherein the circuit external to the first clock generator and the second clock generator further comprises a switch that switches out the series connection of the diode and series LC tank circuit series from the series connected diode, resistor, and series LC tank circuit.

8. The electronic eyewear device of claim 6, wherein the circuit external to the first clock generator and the second clock generator further comprises at least one switch that selectively switches at least one of the series connected diode, resistor, and series LC tank circuit from the series connected diode, resistor, and series LC tank circuit.

9. The electronic eyewear device of claim 1, wherein the second clock generator comprises a ring oscillator circuit and the current pulses are injected into the ring oscillator circuit.

10. The electronic eyewear device of claim 1, wherein the circuit external to the first clock generator and the second clock generator comprises a load capacitance and inductance.

11. A method of synchronizing a first system-on-chip driven by a first clock generator and a second system-on-chip driven by a second clock generator, where the first clock generator and the second clock generator have independent time bases, comprising:
converting an output of the first clock generator into current pulses using a circuit external to the first clock generator and the second clock generator;
injecting the current pulses into the second clock generator to pull an output of the second clock generator into synchronization with the output of the first clock generator.

12. The method of claim 11, wherein the circuit external to the first clock generator and the second clock generator comprises a resistor, and converting the output of the first clock generator into current pulses comprises passing an output voltage of the first clock generator through the resistor.

13. The method of claim 11, wherein the circuit external to the first clock generator and the second clock generator comprises a series connected diode and resistor, and converting the output of the first clock generator into current pulses comprises passing an output voltage of the first clock generator through the series connected diode and resistor to generate harmonics of the output voltage of the first clock generator.

14. The method of claim 11, wherein the circuit external to the first clock generator and the second clock generator comprises a capacitor, and converting the output of the first clock generator into current pulses comprises passing an output voltage of the first clock generator through the capacitor to produce a positive current pulse on rising edges and a negative current pulse on negative edges of the output voltage of the first clock generator.

15. The method of claim 11, wherein the circuit external to the first clock generator and the second clock generator comprises a series connected resistor and a series LC tank circuit, and converting the output of the first clock generator into current pulses comprises passing an output voltage of the first clock generator through the series connected resistor and a series LC tank circuit to convert the output voltage of the first clock generator into the current pulses while passing only specific harmonics from the series LC tank circuit.

16. The method of claim 11, wherein the circuit external to the first clock generator and the second clock generator comprises a series connected diode, resistor and a series LC tank circuit, and converting the output of the first clock generator into current pulses comprises passing an output voltage of the first clock generator through the series connected diode, resistor and a series LC tank circuit to generate specific harmonics of the output of the first clock generator.

17. The method of claim 16, further comprising providing the resistor into the circuit external to the first clock generator and the second clock generator by default by switching out the series connection of the diode and series LC tank circuit.

18. The method of claim 16, further comprising selectively switching at least one of the series connected diode, resistor, and series LC tank circuit into the circuit external to the first clock generator and the second clock generator.

19. The method of claim 11, wherein injecting the current pulses into the second clock generator to pull an output of the second clock generator into synchronization with the output of the first clock generator comprises injecting the current pulses into a ring oscillator circuit of the second clock generator.

20. The method of claim 11, wherein the circuit external to the first clock generator and the second clock generator comprises a load capacitance and inductance, and converting the output of the first clock generator into current pulses comprises passing an output voltage of the first clock generator through the load capacitance and inductance.

* * * * *